(12) United States Patent
Mino et al.

(10) Patent No.: US 8,383,330 B2
(45) Date of Patent: Feb. 26, 2013

(54) PATTERN EXPOSURE METHOD AND PATTERN EXPOSURE APPARATUS

(75) Inventors: Satoshi Mino, Minami-ashigara (JP); Takeshi Fujii, Ashigarakami-gun (JP); Norihisa Takada, Ashigarakami-gun (JP)

(73) Assignee: FUJIFILM Corporation, Tokyo (JP)

( * ) Notice: Subject to any disclaimer, the term of this patent is extended or adjusted under 35 U.S.C. 154(b) by 1358 days.

(21) Appl. No.: 12/066,015

(22) PCT Filed: Sep. 5, 2006

(86) PCT No.: PCT/JP2006/317946
§ 371 (c)(1), (2), (4) Date: Mar. 6, 2008

(87) PCT Pub. No.: WO2007/029852
PCT Pub. Date: Mar. 15, 2007

(65) Prior Publication Data
US 2009/0268186 A1  Oct. 29, 2009

(30) Foreign Application Priority Data

Sep. 7, 2005 (JP) ................ 2005-259119
Sep. 8, 2005 (JP) ................ 2005-260533

(51) Int. Cl.
*G03C 5/06* (2006.01)
(52) U.S. Cl. ........... 430/397; 430/394; 430/322; 355/77
(58) Field of Classification Search ........... 430/394, 430/397, 322; 355/77
See application file for complete search history.

(56) References Cited

U.S. PATENT DOCUMENTS

| 5,652,645 A | 7/1997 | Jain |
| 2002/0182544 A1 | 12/2002 | Chan-Park et al. |
| 2005/0270648 A1* | 12/2005 | Sekine .................. 359/584 |

FOREIGN PATENT DOCUMENTS

| JP | 57-19946 U | 2/1982 |
| JP | 4-67654 U | 6/1992 |
| JP | 6-219587 A | 8/1994 |
| JP | 8-171217 A | 7/1996 |
| JP | 9-274323 A | 10/1997 |
| JP | 9-281478 A | 10/1997 |
| JP | 10-171125 A | 6/1998 |
| JP | 10-233360 A | 9/1998 |
| JP | 11-121374 A | 4/1999 |
| JP | 2000-305274 A | 11/2000 |
| JP | 2003280139 A | * 10/2003 |
| WO | 02/067058 A1 | 8/2002 |

OTHER PUBLICATIONS

Communication, dated May 6, 2011, issued in corresponding EP Application No. 06797772.8, 7 pages.
Abbott et al., "New techniques for laser micromachining MEMS devices," Proceedings of SPIE, vol. 4760, Jan. 1, 2002, pp. 281-288.

* cited by examiner

Primary Examiner — Daborah Chacko Davis
(74) Attorney, Agent, or Firm — Sughrue Mion, PLLC

(57) ABSTRACT

A belt-like work (11) provided with a photosensitive layer is conveyed in a work conveying direction F at a work conveying speed V. An illuminating section (30) illuminates a photomask (29) in an exposure period T synchronized with the work conveying speed V. The photomask (29) is disposed at a proximity gap from the belt-like work (11). Mask patterns (33) on the photomask (29) are exposed on the belt-like work (11) to form periodic patterns thereon.

21 Claims, 24 Drawing Sheets

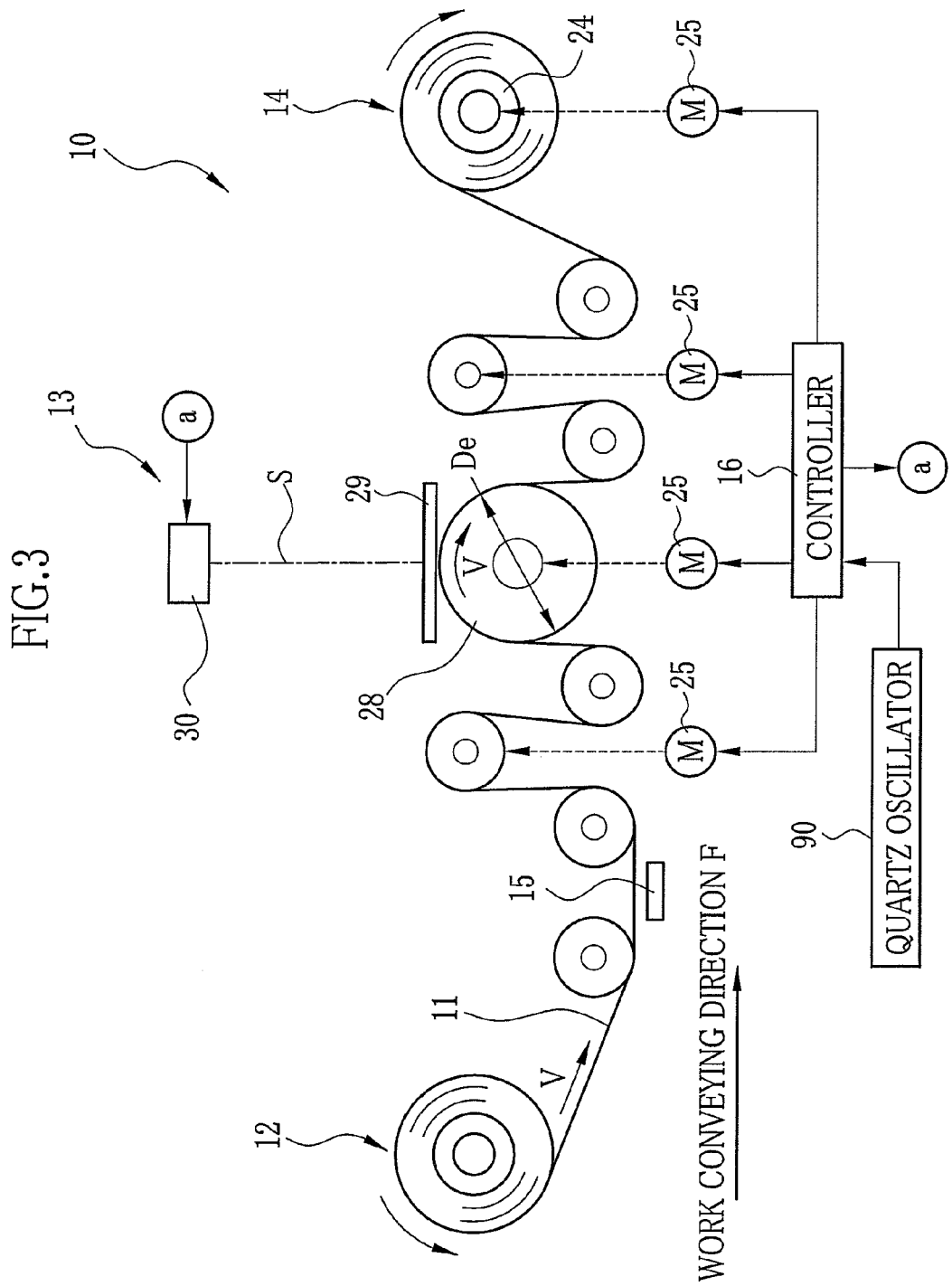

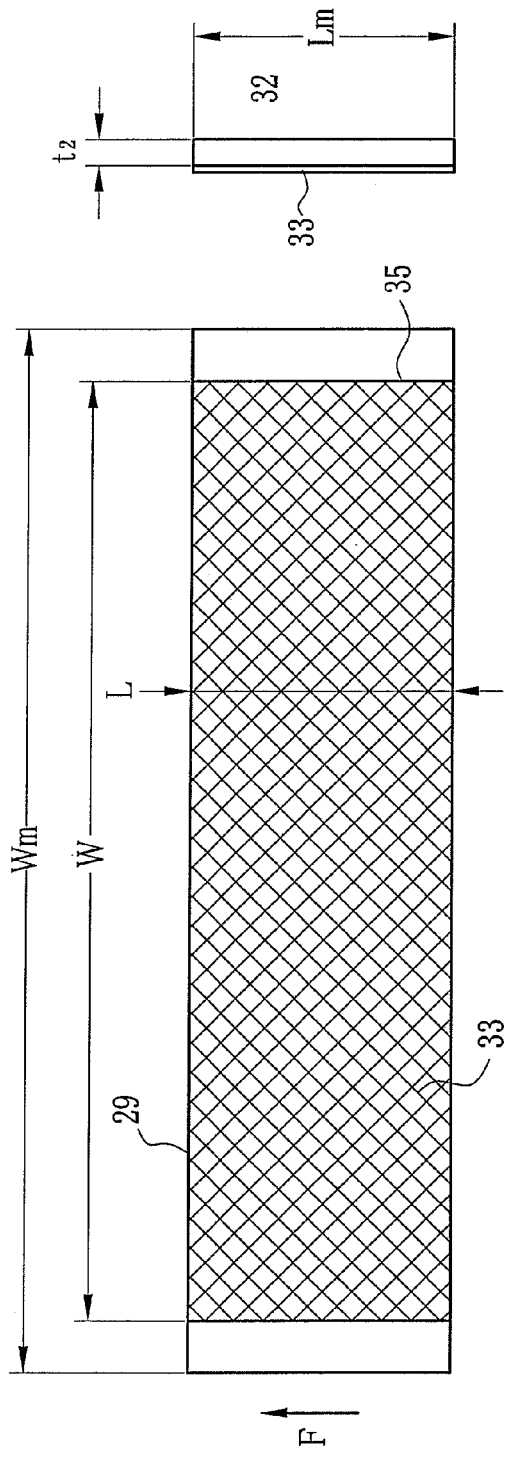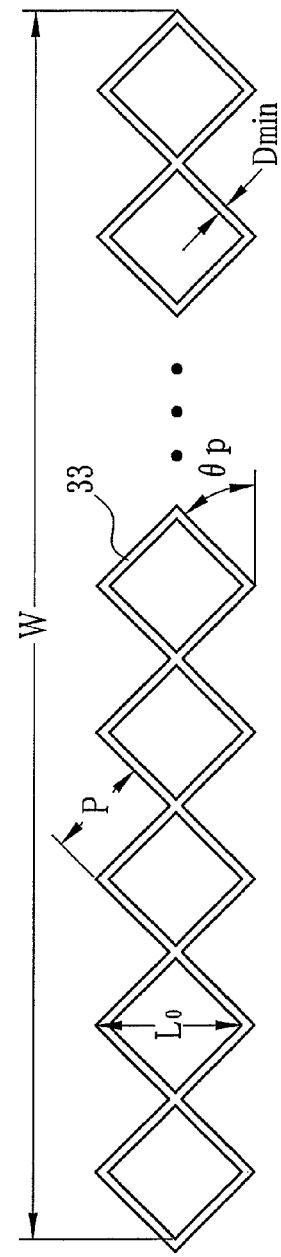

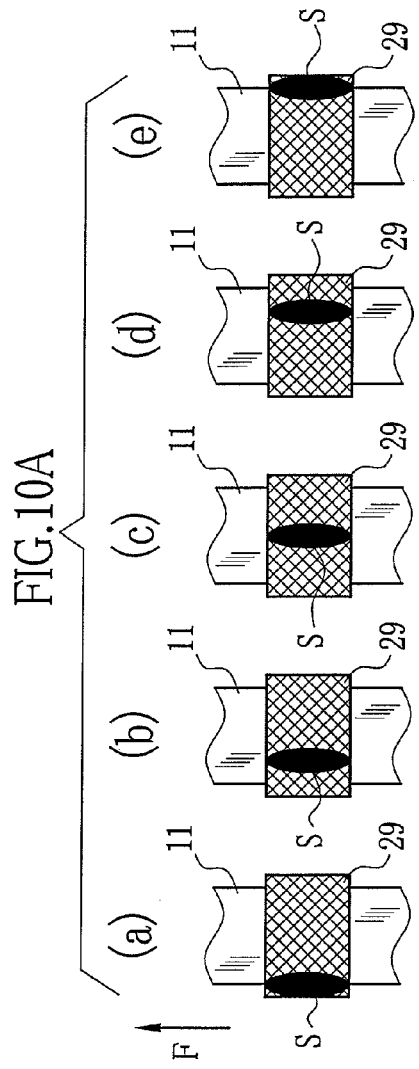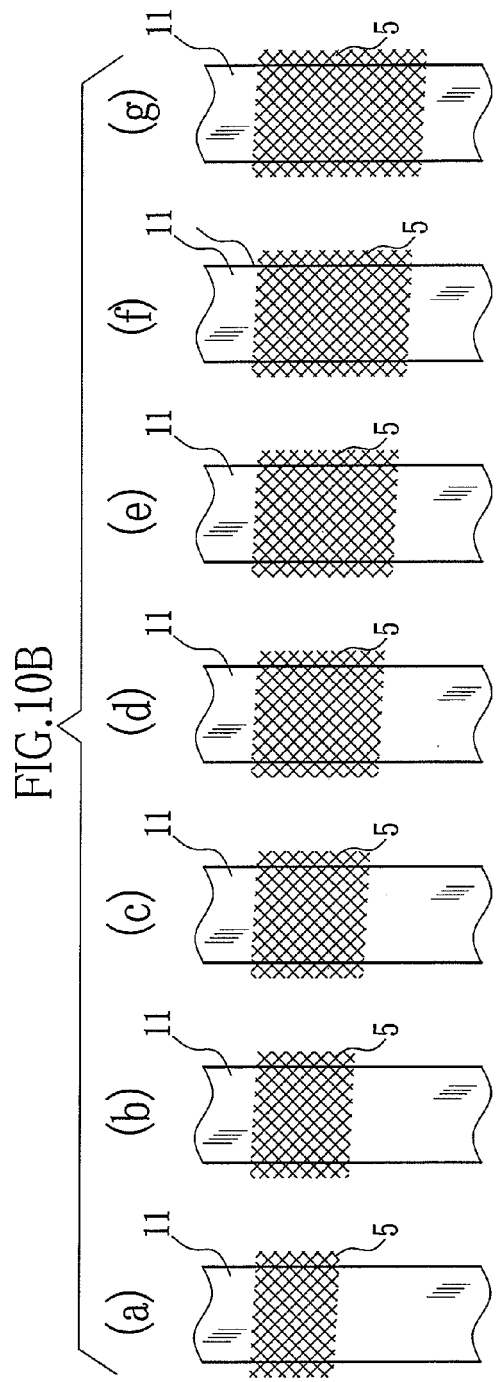

HORIZONTAL AXIS : NUMBER OF SCAN (157Hz)

VERTICAL AXIS : MAXIMUM DEVIATION DISTANCE (mm) FROM FIRST SCAN (ABSOLUTE VALUE)

Lg=50 μm

Lg=100 μm

Lg=150 μm

Lg=450 μm

Lg=500 μm

Lg=550 μm

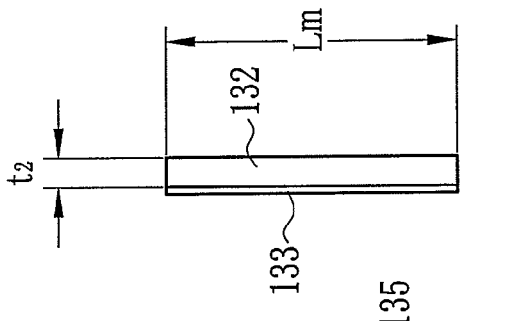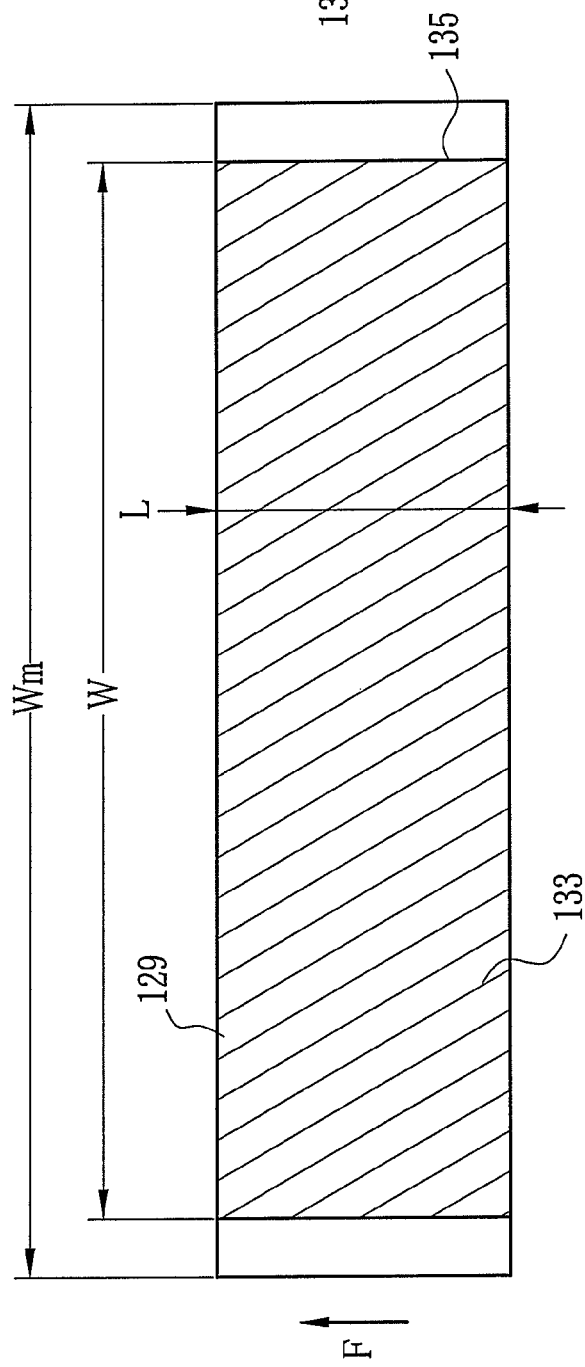

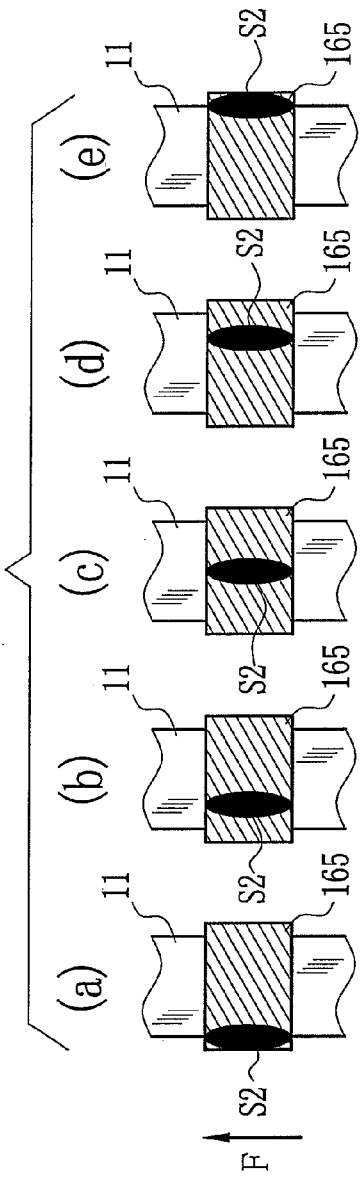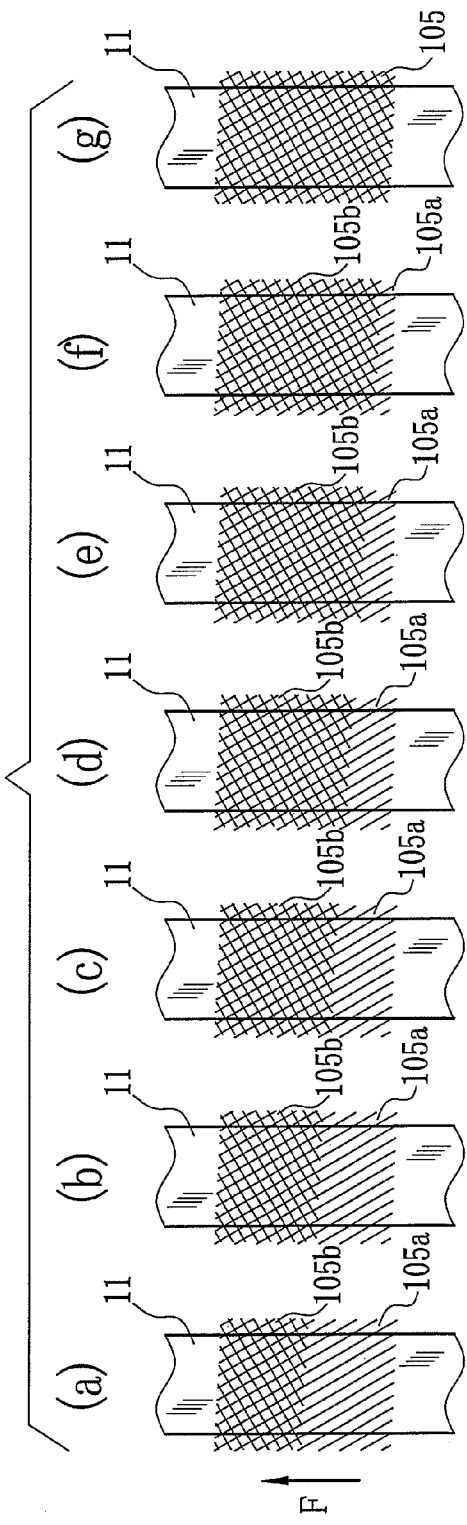

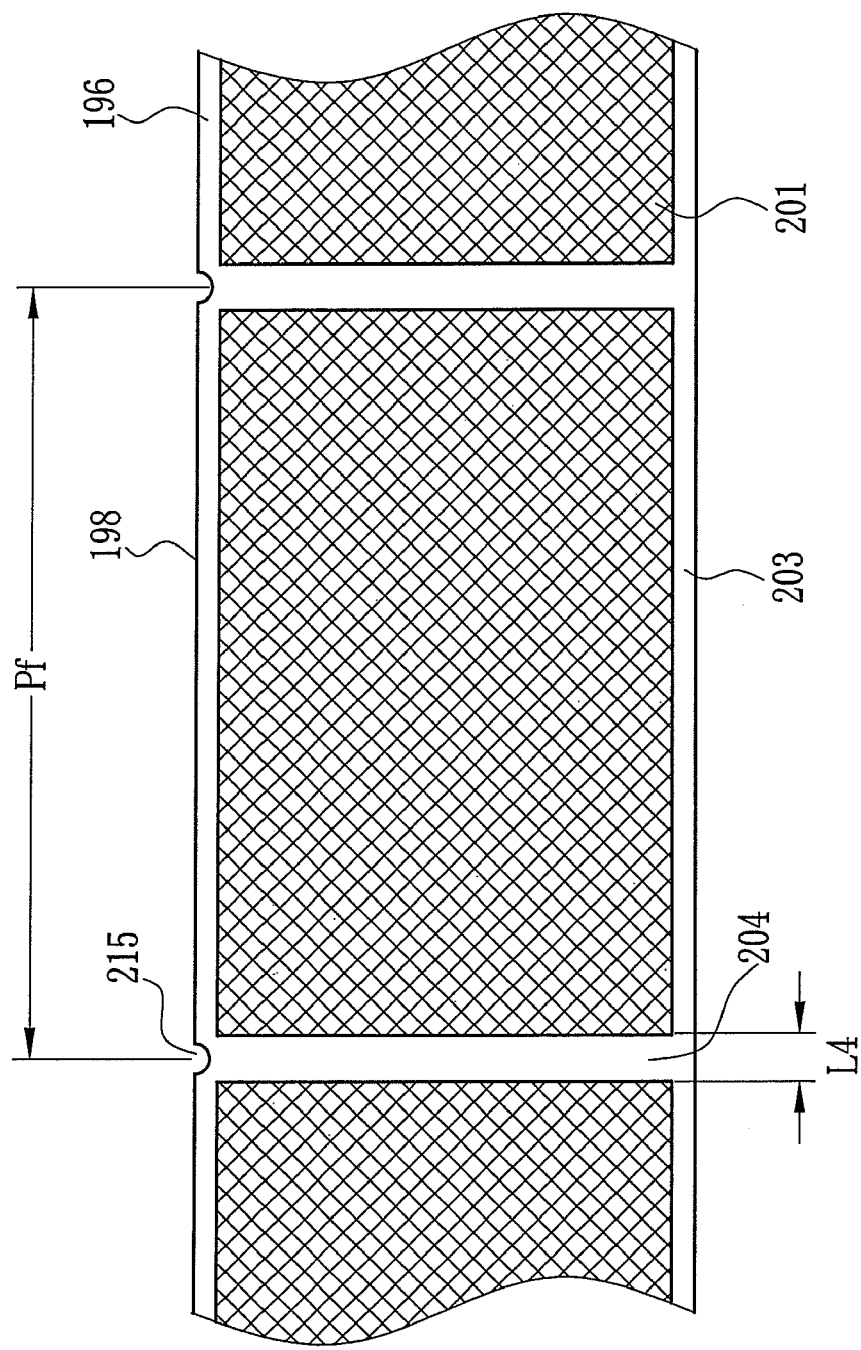

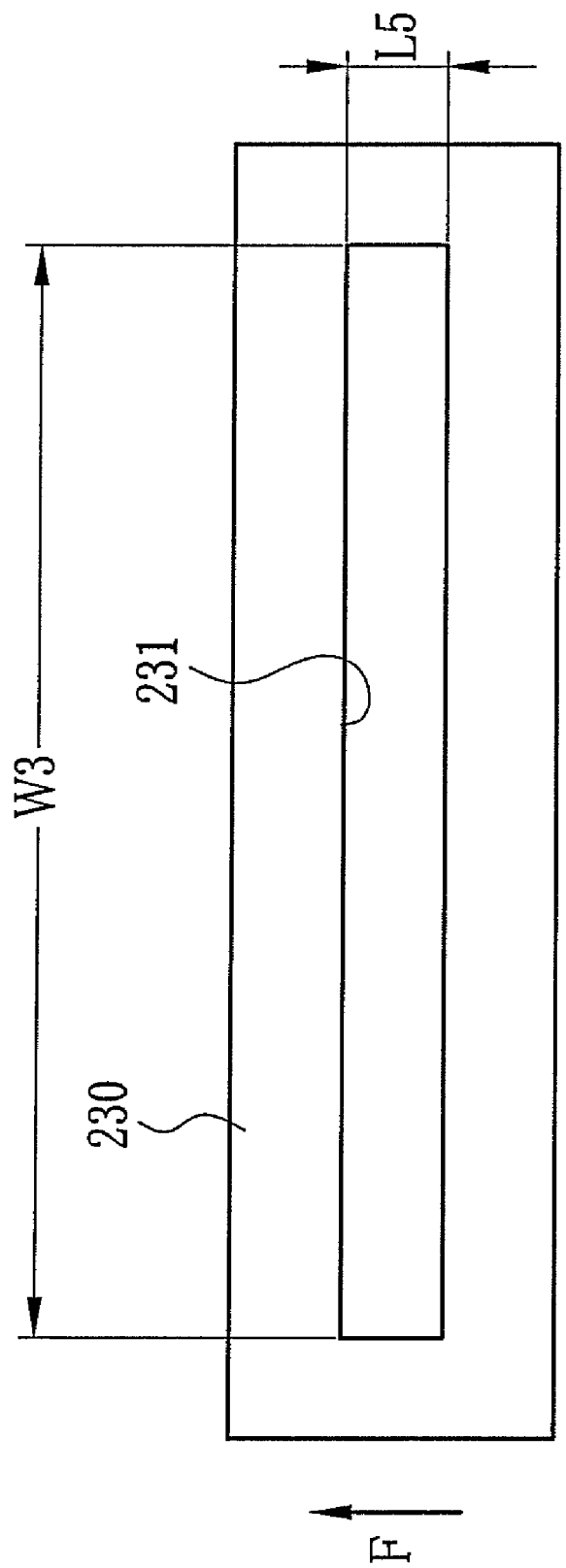

PATTERN EXPOSURE METHOD AND PATTERN EXPOSURE APPARATUS

TECHNICAL FIELD

The present invention relates to pattern exposure method and apparatus, especially pattern exposure method and apparatus for exposing a periodic pattern on a belt-like work while conveying it.

BACKGROUND ART

As an image display device which is thin and has a big screen, a plasma display panel (hereinafter called as PDP) in which light is produced by electric discharge between a front glass plate and a rear glass plate, is in widespread use. In the PDP, to shield electromagnetic waves generated by the electric discharge, an electromagnetic shielding is provided. As the electromagnetic shieldings, there are a thin metal film formed on the front glass plate and an electromagnetic shielding film provided at a front side of the front glass plate. Recently, the electromagnetic shielding film having high shielding performance and high optical transparency is mainly used. The electromagnetic shielding film is a transparent film on which a metal mesh (thin metal lines arranged in a mesh shape) is formed.

Conventionally, the electromagnetic shielding film is formed by pasting a transparent film and a metal foil, and applying a photoetching process to make the metal foil into the mesh shape. However, the applicant has developed an electromagnetic shielding film formed by silver halide photography technique, in which minute meshes of silver halide are formed on a transparent film. In this electromagnetic shielding film, any shape of mesh pattern can be made and size and definition can be appropriately matched to specifications of the panel. In addition, since the pasting of the transparent film and the metal foil, which is complicated and has poor yield, is not required, the cost is reduced and stable supply is realized.

To form the electromagnetic shielding film, a mesh pattern is exposed on a silver salt photosensitive material coated on the transparent film by radiation of light through a mask, and then a mesh of silver salt appears on the transparent film by development. Since a pitch and line width of the mesh largely affect image quality of the PDP, a pattern exposure with high accuracy is required.

Conventionally, in a color filter for display devices, a light shielding pattern and color patterns are formed. To form these patterns, pattern exposure method and apparatus, in which light is radiated on a work having a photosensitive layer through a mask to expose patterns on the work, are used. There are some approaches to apply this method to an exposure process for the electromagnetic shielding film. For example, JP-A-9-274323 discloses a pattern exposure method in which light is radiated though a mask to form a pattern on a belt-like work which is continuously conveyed. In addition, JP-A-10-171125 discloses a proximity exposure apparatus in which positioning, gap setting and proximity exposure are repeated to form a pattern on a belt-like work which is intermittently conveyed.

However, in the pattern exposure method of JP-A-9-274323, since only a stripe pattern parallel to a conveying direction of the belt-like work can be exposed, periodic patterns having various shapes along the conveying direction, such as a mesh pattern suitable for the electromagnetic shielding film, cannot be exposed.

In the proximity exposure apparatus of JP-A-10-171125, although any patterns including periodic patterns can be exposed, a processing capacity per unit time (throughput) is low because total time of the positioning, the gap setting and the exposure during the intermittent conveyance becomes large.

An object of the present invention is to provide a pattern exposure method which can form periodic patterns of various shapes arranged in a work conveying direction in high throughput, and a simple and low cost pattern exposure apparatus for forming the patterns.

DISCLOSURE OF INVENTION

In order to achieve the above object and other objects, a pattern exposure method of the present invention comprises steps of continuously conveying a belt-like or sheet-like work having photosensitive layer and periodically applying proximity exposure for a certain exposure time to the work through a photomask having a mask pattern disposed at a predetermined proximity gap from the work. Accordingly, a periodic pattern of the mask patterns along conveying direction of the work are formed on the work.

When a length of one period of the periodic pattern is a period length $L_0$, a width of the work in a direction perpendicular to the work conveying direction is a work width $W_0$, a length in the work conveying direction of a pattern area on which the mask pattern is provided is a pattern length L, a length in a work width direction of the pattern area is a pattern width W, a conveying speed of the work is V, an exposure period for exposing the periodic pattern is T, the exposure time is $T_{exp}$, and a minimum line width of the mask pattern is Dmin, an exposure area covering at least one period of the mask patterns is subject to the proximity exposure for the exposure time $T_{exp}$ in the exposure period T, under following condition formulae:

$L_0 < L$;

$W_0 < W$;

$L_0/V \geq T$; and $V \cdot T_{exp} < D\min$

It is preferable that a single exposure is controlled not to provide a desired exposure density to the work, and the exposure density of the work reaches the desired value by a multiple exposure of n times.

A relation $Lb > L_0$ is satisfied when a length of light projected on the photomask from an exposure light source in the work conveying direction is Lb. In addition, when a quotient of $Lb/L_0$ being m (m is a natural number), the photomask has at least m numbers of the mask patterns in the work conveying direction, and a relation between the work conveying speed V and the exposure period T satisfying following formulae:

$(n-1) \times (L_0/V) = T$ (n is a natural number); and $2 \leq n \leq m$

In this condition, the same latent pattern as exposed through a first mask pattern disposed uppermost in the work conveying direction is additionally-exposed on the first latent pattern through a nth mask pattern disposed downstream from the first mask pattern by synchronization between the work conveying speed V and the exposure period T when this portion passes below the nth mask pattern.

It is preferable that the exposure light source scans light in one direction during the exposure period T to expose overall width of the work through the photomask. It is preferable that the exposure light source is a semiconductor laser emitter, and the exposure is performed with the laser beam emitted from the semiconductor laser emitter and then collimated by a collimating lens. It is also preferable that the exposure light source is two channels of semiconductor laser emitters, and the exposure is performed with the laser beams which are subjected to polarization multiplexing and then collimated by a collimating lens. Further, it is also preferable that the exposure light source is a plurality of semiconductor laser emitters, and the exposure is performed with the laser beams which are collimated respectively by a corresponding collimating lens and then the collimated beams are composited in a small area. A wavelength of the laser beam is preferably approximately 405 nm which is appropriate for the photosensitive material.

It is preferable that the mask patterns are inclined in the amount of V·W/Vb which is a moving length of the work in one scan, wherein Vb is a scan speed of the light from the exposure light source, toward a downstream side of laser scan in the work conveying direction from a position where the width direction of the mask patterns is perpendicular to the work conveying direction.

It is preferable that the exposure light source changes the intensity of the light in response to the change of the scan speed, so that exposure amount on the work is kept constant in overall width.

It is preferable that the mask pattern is formed such that their position is shifted Lg·sin θ toward inside in the width direction according to change of incident angle θ of the light from the exposure light source, when the proximity gap is Lg.

It is preferable that a width of the mask pattern is varied in a width direction of the scan, to keep a line width of the periodic patterns on the work uniform along the width direction.

Instead of scanning, it may be possible to use an exposure light source which projects light on overall width of the work through the photomask for the exposure time $T_{exp}$. This exposure light source satisfies a following formula:

$$Lw > W$$

Wherein Lw is a length of the light on the photomask in the width direction of the work.

In addition, the proximity gap is preferably no more than 500 μm.

It is preferable that the photosensitive layer is a silver salt photosensitive material or a photoresist. It is preferable that the silver salt photosensitive material has a gradation γ (a slope of density characteristic curve when a horizontal axis represents light amount and a vertical axis represents density) of at least 5.

It is preferable that the periodic patterns are continuous seamless patterns. When the periodic pattern has a line width of no more than 20 μm, it is suitable for the manufacture of an electromagnetic shielding member.

It is preferable that the proximity exposure is applied to the belt-like work which is hanged on a roller through the photomask disposed close to an outer periphery of the roller.

It is preferable that synchronization between a conveying speed of the work and an exposure period for exposing the periodic patterns is monitored, and that the exposure is performed only while the synchronization is established.

It is preferable that a gap between the photomask and the work becomes larger than the proximity gap when a work joining section, which is a joint portion of two of the belt-like works, passes near the photomask, and the gap returns to the proximity gap after the passage of the work joining section.

Another embodiment of the pattern exposure method of the present invention comprises steps of continuously conveying a belt-like or sheet-like work having photosensitive layer to the vicinity of plural photomasks each of which has a mask pattern arranged along the conveying direction, and applying proximity exposure to the work through the photo masks during an exposure period and an exposure time synchronized with a conveying speed of the work with use of plural exposure sections each of which includes one of the photomasks. Accordingly, periodic patterns which are a periodic arrangement of the mask patterns along conveying direction of the work are formed on the work.

The periodic patterns formed by the plural exposure sections are different from each other. It is preferable that one of the periodic patterns are first thin lines having a certain angle from the work conveying direction and the other are second thin lines having a certain angle from the first thin line, and a combination of the first lines and the second lines make mesh patterns. It is preferable that the mesh patterns form an electromagnetic shielding member.

It is preferable that the plural exposure sections are a first exposure section and a second exposure section, the first exposure section performs exposure of first pattern which is periodic and continuous along the work conveying direction in a first exposure period, and the second exposure section performs exposure of second pattern which is periodic and intermittent along the work conveying direction in a second exposure period.

It is preferable that the first pattern is a mesh pattern forming an electromagnetic shielding member or mesh patterns with rim sections at both ends in the work conveying direction, and the second pattern is a pattern which intermittently crosses the mesh pattern in a width direction of the work.

It is preferable that the photosensitive layer is a silver salt photosensitive material or a photoresist.

It may be possible that the exposure period of at least one of the plural exposure sections is different from that of other exposure sections.

It is preferable that the work conveying speed, the exposure period and the exposure time are synchronized with each other based on a common reference clock.

It is preferable that reference marks are applied to the work with predetermined intervals at an upstream side from the plural exposure sections in the work conveying direction, and each of the exposure sections detect the reference marks to determine exposure timing. It is preferable that the reference marks are notches formed by a notching process, laser marks formed by a laser marker, holes formed by a piercing process, or magnetic signals in a magnetic recording sections formed on a lateral edge of the work.

A pattern exposure apparatus of the present invention comprises a conveyer section for continuously conveying a belt-like or sheet-like work having photosensitive layer at a work conveying speed V, a photomask disposed at a predetermined proximity gap Lg from the work and having a mask pattern, an illuminating section for performing proximity exposure by illuminating overall the work along a width direction perpendicular to a conveying direction through the photomask for an exposure time $T_{exp}$ in every exposure period T, and a controller for establishing a synchronization among the work conveying speed V, the exposure period T and the exposure time $T_{exp}$. This synchronization serves to form the periodic pattern which is a periodic arrangement of the mask patterns along conveying direction of the work.

The illuminating section includes an exposure light source for projecting light toward the photomask and a scanner for scanning the light in one direction during the exposure period T to expose overall width of the work through the photomask.

It is preferable that the exposure light source includes a semiconductor laser emitter and a collimating lens for collimating the laser beam emitted from the semiconductor laser emitter. It is also preferable that the exposure light source includes two channels of semiconductor laser emitters, an optical member for performing polarization multiplexing of two channels of laser beams emitted from the semiconductor laser emitters, and a collimating lens for collimating the multiplexed laser beam. Further, it is also preferable that the exposure light source includes a plurality of semiconductor laser emitters, a plurality of collimating lenses for collimating plural laser beams respectively, and a plurality of optical members for compositing the collimated beams in a small area.

The scanner includes a polygon mirror having a plurality of reflecting surfaces which reflect light from the exposure light source toward the photomask and a driver for rotating the polygon mirror.

It is preferable that the illuminating section further includes a light amount adjuster for adjusting intensity of the light from the exposure light source in response to the change of the scan speed, so that exposure amount on the work is kept constant in overall width.

It is preferable that a roller on which the belt-like work is hanged is provided and the photomask is disposed at proximity gap Lg from an outer periphery of the roller.

It is preferable that the controller monitors synchronization between operations of the conveying section and the illuminating section to control the illumination section to emit the light only while the synchronization is established.

In addition, it is preferable that a mask holding section is provided. The mask holding section preferably includes a holding frame for holding the photomask, a support for supporting the holding frame movably between an exposing position where the photomask held by the holding frame faces the work through a proximity gap Lg, and a retreat position where a gap between the photomask 29 and the work is larger than the proximity gap Lg and a driver for moving the holding frame between the exposing position and the retreat position. It is preferable that the holding frame has an adjustment section which adjusts the proximity gap Lg by moving the photomask closer to or away from the work.

Another embodiment of the pattern exposure apparatus of the present invention comprises a conveyer section for continuously conveying a belt-like or sheet-like work having photosensitive layer, a plurality of illuminating sections each of which performs proximity exposure by illuminating the work for a predetermined exposure time in every predetermined exposure period, and a controller for establishing a synchronization among a work conveying speed by the conveyor section, an exposure period and an exposure time by the plurality of illumination sections. Each of the illuminating sections includes a photomask with a mask pattern disposed at a proximity gap from the work and an exposure light source which emits light toward the work through the photomask, and the synchronization serves to form the periodic pattern which is a periodic arrangement of the mask pattern along conveying direction of the work.

The plural exposure sections are a first exposure section having a first photomask with a first mask pattern and a second exposure section having a second photomask with a second mask pattern, the first mask pattern and the second mask pattern are different.

It is preferable that the first mask pattern is a plurality of thin lines arranged with a pitch P1 each of which has an angle $\theta_1$ ($-90° \leq \theta_1 \leq 90°$) from the work conveying direction and a width D1, the second mask pattern is a plurality of thin lines arranged with a pitch P2 each of which has an angle $\theta_2$ ($-90° \leq \theta_2 \leq 90°$, $\theta_1 \neq \theta_2$) from the work conveying direction and a width D2, and a combination of exposure of the first mask pattern and that of the second mask pattern makes a mesh pattern periodically arranged along the work conveying direction on the work.

When the work has a width W0 in a work width direction perpendicular to the work conveying direction, the first mask pattern has a period length L1 ($L1=P1/\sin \theta_1$) in the work conveying direction, and the second mask pattern has a period length L2 ($L2=P2/\sin \theta_2$) in the work conveying direction, the first mask pattern is provided in a pattern area having a length equal to or more than the period length L1 in the work conveying direction and a width equal to or more than the width W0 in the work width direction, and the second mask pattern is provided in a pattern area having a length equal to or more than the period length L2 in the work conveying direction and a width equal to or more than the width W0 in the work width direction.

The exposure period of the first exposure section is a first exposure period in which one scan is performed every time the work is conveyed to a length $n \cdot L1$ (n is an integer at least 1), and the exposure period of the second exposure section is a second exposure period in which one scan is performed every time the work is conveyed to a length $n \cdot L2$ (n is an integer at least 1). In this case, it is preferable that the periodic patterns are mesh patterns forming an electromagnetic shielding member.

It is also preferable that the first exposure section performs exposure of first pattern which is periodic and continuous along the work conveying direction in a first exposure period, and the second exposure section performs exposure of second pattern which is periodic and intermittent along the work conveying direction in a second exposure period.

Concretely, it is preferable that the first pattern includes a mesh pattern and the second pattern includes a belt-like pattern which is perpendicular to the work conveying direction. In this case, it is preferable that the mesh pattern form an electromagnetic shielding member, and the belt-like pattern intermittently crosses the mesh pattern.

It is preferable that a reference clock generator, which generates a reference clock as a reference for the synchronization, is provided.

In addition, it is preferable that a mark applying section which applies reference marks to the work with predetermined intervals at an upstream side from the plural exposure sections in the work conveying direction, and a mark detecting section which detects the reference marks are provided so that each of the exposure sections determine exposure timing based on detection of the reference marks. It may be also that the reference marks are preliminarily provided on the work, and the mark detection section is provided in each of the exposure section.

According to the present invention, since the exposure can be performed while the work is continuously conveyed, productivity will be increased. Since the pattern exposure can be performed by the simple equipment, equipment spending will be reduced. Since the multiple exposure and the scan exposure make the brightness distribution of the light source uniform, the uniform line width of the pattern can be formed. Since sufficient exposure amount is obtained by the multiple exposure even if the light intensity of the light source is small, the cost for the exposure can be reduced. Since the photomask is used for the proximity exposure, minute patterns can be drawn. In addition, since the photomask is small, it is easy to handle. Since the photomask is usable at plural different positions and a running cost is small, cost performance will be increased. In addition, when drawing the seamless patterns, since the multiple exposure is performed while continuous conveyance of the work, a joint of patterns is easily made with high accuracy.

In case the multiple exposure is performed while the continuous conveyance, since the latent image can be designed to appear only at positions where plural times of additional-exposure is applied, a position exposed with blurring (exposed with insufficient light amount) can be designed not to generate an image. Accordingly, the exposure with bluring does not affect the quality of product, and satisfies both of the high quality of patterns and the productivity by the continuous conveyance.

In addition, even a complicated pattern, as long as formed by a combination of periodic patterns, can be exposed by an inexpensive construction of the apparatus with use of the plural masks. Further, high-value added patterns can be formed by combinations of light sources of different wavelengths and photosensitive materials. The reference mark for the exposure can be used also for a reference in post-processes.

BRIEF DESCRIPTION OF DRAWINGS

FIG. 3 is a schematic view showing construction of a pattern exposure apparatus of the present invention;

FIG. 5A is a plan view of a photomask;

FIG. 5B is a side view of the photomask;

FIG. 5C is a partially enlarged explanatory view of a mask pattern on the photomask;

FIG. 10A is an explanatory view showing scan process of the laser beam on the photomask;

FIG. 10B is an explanatory view showing the pattern exposed on the work;

FIG. 20A is a plan view of a first photomask;

FIG. 20B is a side view of the first photomask;

FIG. 23A is an explanatory view showing scan process of the laser beam on the second photomask;

FIG. 23B is an explanatory view showing the pattern exposed on the work by a second exposure section;

FIG. 25 is a plan view of a belt-like work on which the electromagnetic shielding film having the rim is formed;

FIG. 28 is a plan view of a second photomask for exposure of the electromagnetic shielding film having the rim.

BEST MODE FOR CARRYING OUT THE PRESENT INVENTION

Figure 1A:
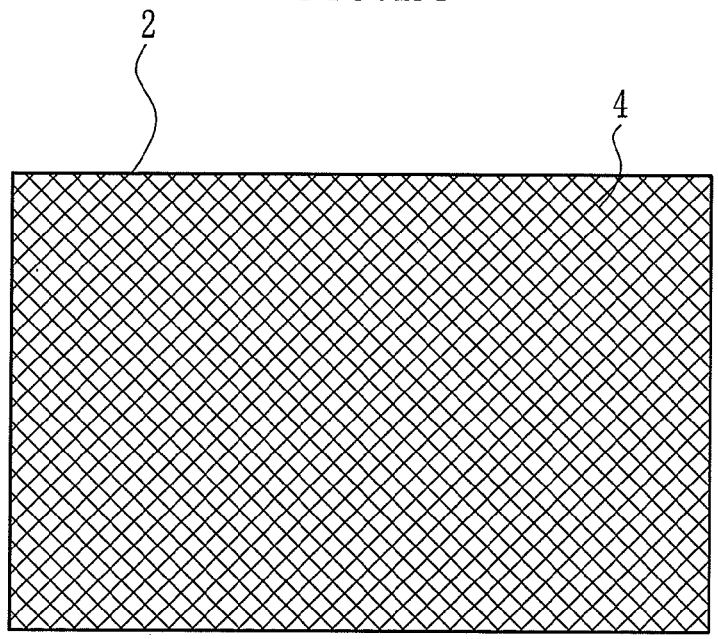
FIG. 1A is a plan view of an electromagnetic shielding film formed by the present invention.
Figure 1B:
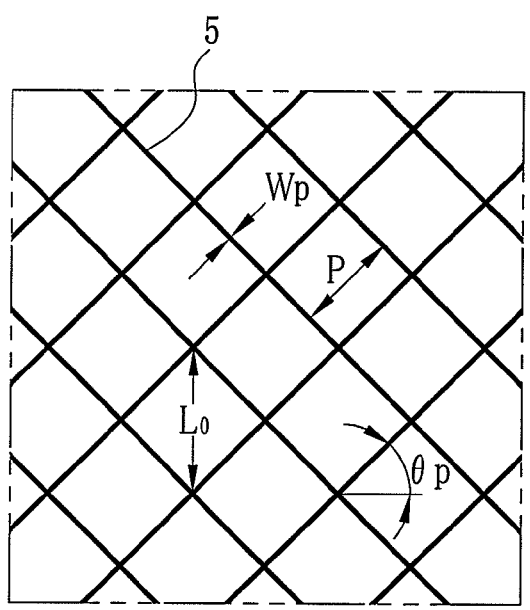
FIG. 1B is a partially enlarged view of FIG. 1A.
Figure 2:
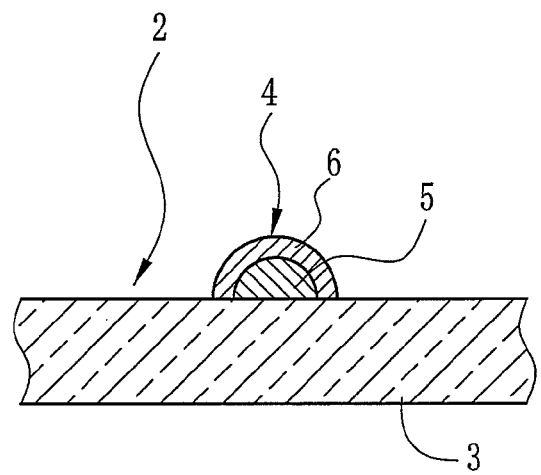
FIG. 2 is a cross-sectional view of the electromagnetic shielding film.

As shown in FIG. 1A, an electromagnetic shielding film 2 comprises a transparent film 3 and a mesh-like electromagnetic shielding pattern 4 of silver salt formed on the transparent film 3. As shown in FIG. 2, the electromagnetic shielding pattern 4 is composed of a periodic pattern 5 on the transparent film 3 formed of the silver salt and a copper plating 6 applied on the surface of the periodic pattern 5 to give an electromagnetic shielding function. As shown in FIG. 1B in partially-enlarged manner, the periodic pattern 5 has thin lines arranged at right angles to each other at spacing pitch P of 300 μm and alignment angle θp of 45°, each of which has a width Ws of 10 μm to 20 μm.

As shown in FIG. 3, a pattern exposure apparatus 10 for forming the periodic pattern 5 comprises a work feeding section 12 for feeding belt-like works 11 as base material of the transparent film 3, an exposure section 13 for exposing a silver salt photosensitive material on the belt-like work 11 in a shape of the periodic pattern 5, a work winding section 14 for winding the exposed belt-like work 11, a work joining section 15 for joining a trailing end of the foregoing belt-like work 11 and a leading end of a following belt-like work 11 when a plurality of the belt-like works 11 are continuously processed, and a controller 16 for totally controlling these sections.

The belt-like work 11 exposed in the shape of the periodic pattern 5 is developed in a next process to form the periodic pattern 5 of the silver halide on one surface thereof. The copper plating 6 is applied on the periodic pattern 5, and then the work is cut off to a predetermined length to be the electromagnetic shielding film 2.

The periodic pattern 5 is a plurality of rhombuses arranged in a width direction which is orthogonal to a conveying direction of the belt-like work 11 (hereinafter called as the work conveying direction). Each rhombus has sides of 300 μm and a diagonal length of 424 μm (in the work conveying direction). Accordingly, a length of one period of the periodic pattern 5 (the period length $L_0$) is 424 μm.

Figure 4A:
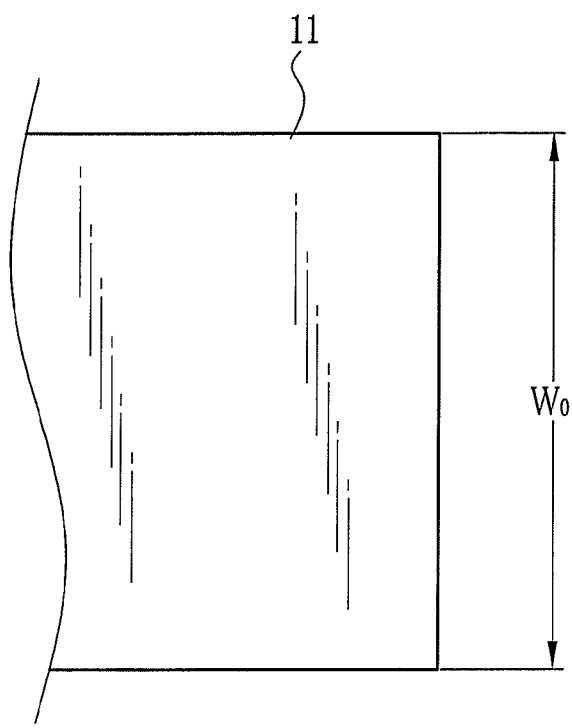
FIG. 4A is a plan view of a belt-like work as a base of the electromagnetic shielding film.
Figure 4B:
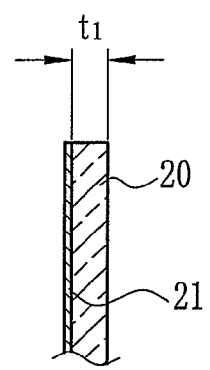
FIG. 4B is a cross-sectional view of the belt-like work.

As shown in FIG. 4A and FIG. 4B, the belt-like work 11 is composed of a long film 20 as the base material of the transparent film 3 and a silver salt photosensitive material 21 coated on the long film 20. The long film 20 is for example a transparent PET film having thickness $t_1$ of 100 μm and work length $W_0$ of 650 mm to 750 mm. The long film 20 of 100 m to 1000 m length is wound in a roll and set in the work feeding section 12.

The leading end of the belt-like work 11 in the work feeding section 12 is drawn to be hanged on plural rollers and held on a winding reel 24 of the work winding section 14. The winding reel 24, an exposure roller 28 and a plurality of drive rollers (not shown), which constitute a conveyer section, are rotated in a winding direction by a motor group 25 to convey the belt-like work 11 from the work feeding section 12 to the work winding section 14 in the work conveying direction F. A work conveying speed V of the belt-like work 11 is for example 4m/min. Note that the work conveying speed V may be optimized according to sensitivity of the photosensitive material, power of a light source for the exposure, and so on.

The silver salt photosensitive material 21 is designed to have a center of sensitivity at for example 405 nm wavelength. Note that the spectral sensitivity characteristic is not limited to this but optimized to the wavelength of the light source. In addition, the silver salt photosensitive material 21 has a large value of γ (exposure amount/density). This is a so-called high contrast material, in which the density does not increases gradually according to increase of the exposure amount, but rapidly increases after the exposure amount reaches a certain amount.

Hereinafter, photosensitive material for conductive metal layer as the silver salt photosensitive material 21 of the belt-like work 11, and translucent electromagnetic shielding film as the electromagnetic shielding film 2 formed of the photosensitive material will be described in detail.

1. Photosensitive Material for Forming Conductive Metal Layer

[Emulsion Layer]

The photosensitive material to be employed in the producing method of the present invention has, on the substrate, an emulsion layer containing a silver salt as a photosensor (silver salt containing layer). A degree of swelling of the emulsion layer is at least 150% in the present invention. In the present invention, the degree of swelling is defined as follows:

$$\text{Degree of swelling (\%)} = 100 \times ((b)-(a))/(a)$$

In the formula, (a) represents a thickness of the emulsion layer when it is dried, and (b) represents a thickness of the emulsion layer after it has been dipped in distilled water at 25° C. for 1 minute.

The measurement of (a) can be performed by use of a scanning electron microscope which scans a cross-section of a sample. The measurement of (b) can be performed by use of the scanning electron microscope for scanning the cross-section of the sample, after the swelled sample was freeze-dried with liquid nitrogen.

Although the degree of swelling of the emulsion layer is at least 150% in the present invention, a preferable range of the degree of swelling depends on a ratio of Ag/binder in the emulsion layer. The reason is that the binder in the layer can be swelled while silver halide particles in the layer cannot. The more the ratio of Ag/binder increases, the more the degree of swelling of the whole emulsion layer decreases even if the degree of swelling of the binder is the same. In the present invention, the degree of swelling of the emulsion layer is preferably at least 250% when the ratio of Ag/binder is less than 4.5, and at least 200% when the ratio of Ag/binder is at least 4.5 and less than 6. When the ratio of Ag/binder is in a range of 6 to 10, which is the most preferable ratio in the present invention, the degree of swelling of the emulsion layer is preferably at least 150%, more preferably at least 180%.

In the present invention, although there is no higher limit to the degree of swelling, it is preferably no more than 350% because too much degree of swelling decreases film strength in the processing and the film becomes fragile. The degree of swelling of the emulsion layer can be controlled by addition amount of hardener, and pH and moisture content of the emulsion layer after coating.

The emulsion layer in the present invention may contain a dye, a binder, a solvent and the like, in addition to the silver salt emulsion, if necessary. Hereinafter, each content in the emulsion layer will be described.

<Silver Salt Emulsion>

A silver salt emulsion to be employed in the present invention can be an inorganic silver salt such as silver halide, or an organic silver salt such as silver acetate. In the present invention, silver halide is preferably employed for an excellent property as a photosensor, and technologies of a silver salt photographic film, a photographic paper, a lithographic film and an emulsion mask for a photomask relating to silver halide are applicable also to the present invention.

A halogen element contained in the silver halide may be any of chlorine, bromine, iodine and fluorine or a combination thereof. For example, a silver halide principally formed by AgCl, AgBr or AgI is employed preferably, and a silver halide principally formed by AgBr or AgCl is employed more preferably. Also silver chlorobromide, silver iodochlorobromide or silver iodobromide can be employed preferably. More preferably employed is silver chlorobromide, silver bromide, silver iodochlorobromide or silver iodobromide, and most preferable is silver chlorobromide or silver iodochlorobromide containing silver chloride by 50 mol. % or more.

A term "silver halide principally formed by AgBr (silver bromide)" T means silver halide in which bromine ions represent a molar ratio of 50% or higher in the composition of silver halide. Such silver halide particle principally formed by AgBr may contain iodine ions or chlorine ions in addition to bromine ions.

Note that preferable content of silver iodide in the silver halide emulsion is 1.5 mol % per one mol of silver halide emulsion. In this condition, generation of low fog is prevented and pressure characteristic is improved. The content of silver iodide in the silver halide emulsion is more preferably no more than 1 mol % per one mol of silver halide emulsion.

Silver halide is in solid grains, and, in consideration of an image quality of a patterned metallic silver layer formed after the exposure and the development process, preferably has an average grain size of 0.1 nm to 1000 nm (1 μm) in a sphere-corresponding diameter, more preferably 0.1 nm to 100 nm and further preferably 1 nm to 50 nm.

A sphere-corresponding diameter of silver halide grain means a diameter of a spherical particle of a same volume.

The silver halide grain is not particularly limited in the shape, and may have various shapes such as spherical, cubic, planar (hexagonal flat plate, triangular flat plate or tetragonal flat plate), octahedral or tetradecahedral, and preferable is cubic or tetradecahedral.

In the silver halide grain, an interior and a surface part may have a uniform phase or different phases. Also a localized layer of a different halogen composition may be provided in the interior or on the surface of the grain.

The silver halide emulsion for use in the present invention can be prepared using methods described, for example, by P. Glafkides, in Chimie et Physique Photographique, Paul Montel (1967); by G. F. Duffin, in Photographic Emulsion Chemistry, The Focal Press (1966); and by V. L. Zelikman et al., in Making and Coating Photographic Emulsion, The Focal Press (1964).

More specifically, either an acid process or a neutral process may be used. Further, a soluble silver salt and a soluble halogen salt may be reacted by any of a single jet method, a double jet method, and a combination thereof.

A method of forming grains in the presence of excessive silver ion (the so-called reverse-mixing method) may also be used. As one form of the double jet method, a method of maintaining the pAg constant in the liquid phase where silver halide is produced, namely, a so-called controlled double jet method, may be used.

Further, it is preferred to form grains using a so-called silver halide solvent, such as ammonia, thioether, or tetra-substituted thiourea, more preferably using a tetra-substituted thiourea compound, which are described in JP-A-53-82408 and JP-A-55-77737. Preferred examples of the thiourea compound are tetramethylthiourea and 1,3-dimethyl-2-imidazolidinethione. The amount of silver halide solvent to be added varies depending on the kind of the compound to be used or the grain size and the halogen composition to be obtained, but it is preferably from $10^{-5}$ mol to $10^{-2}$ mol, per one mol of silver halide.

According to the controlled double jet method and the method of forming grains using a silver halide solvent, a silver halide emulsion comprising grains having a regular crystal form and a narrow grain size distribution can be easily prepared. These methods are useful means for preparing the silver halide emulsion for use in the present invention.

In order to render the grain size uniform, it is preferred to rapidly grow grains within the range not exceeding the critical saturation degree, using a method of changing the addition rate of silver nitrate or alkali halide according to the grain growth rate, as described in British Patent No. 1,535,016, JP-B-48-36890, and JP-B-52-16364, or a method of changing the concentration of the aqueous solution, as described in British Patent No. 4,242,445 and JP-A-55-158124.

The silver halide emulsion employed for forming the emulsion layer of the present invention is preferably a single-dispersion emulsion, having a variation factor represented by {(standard deviation of grain size)/(average grain size)}×100 of 20% or less, more preferably 15% or less and most preferably 10% or less.

The silver halide emulsion employed in the present invention may also be a mixture of plural silver halide emulsions of different grain sizes.

The silver halide emulsion for use in the present invention may contain a metal that belongs to the group VIII or the group VIIB. It is especially preferred to contain such a metal compound as a rhodium compound, an iridium compound, a ruthenium compound, an iron compound and an osmium compound to thereby attain a high contrast and a low fog. These compounds can contain various ligands, which can be, for example, a cyan ion, a halogen ion, a thiocyanate ion, a nitrosyl ion, water or a hydroxide ion, and which can also be, in addition to such pseudo halogen, ammonia, or an organic molecule for example an amine (such as methylamine or ethylenediamine), a heterocyclic compound (such as imidazole, thiazole, 5-methylthiazole or mercaptoimidazole), urea or thiourea.

Further, the silver halide particles are advantageously doped with a metal complex hexacyanide such as $K_4[Fe(CN)_6]$, $K_4[Ru(CN)_6]$ or $K_3[Cr(CN)_6]$ for sensitivity enhancement.

As a rhodium compound for use in the present invention, a water-soluble rhodium compound can be used. Examples of the rhodium compound include rhodium (III) halide compounds, a hexachloro rhodium (III) complex salt, a pentachloroaqua rhodium (III) complex salt, a tetrachlorodiaqua rhodium (III) complex salt, a hexabromo rhodium (III) complex salt, a hexamine rhodium (III) complex salt, a trioxalato rhodium (III) complex salt and $K_3Rh_2Br_9$.

The above-described rhodium compound is generally dissolved in water or an appropriate solvent before use, and a common method for stabilizing a solution of the rhodium compound, namely, a method of adding an aqueous solution of hydrogen halogenide (e.g. hydrochloric acid, hydrobromine acid, hydrofluoric acid) or an alkali halide (e.g. KCl, NaCl, KBr, NaBr), may be used. It is also possible to add and dissolve separately prepared silver halide grains that are previously doped with rhodium, in place of a water-soluble rhodium compound, at the preparation of silver halide.

Examples of the iridium compound for use in the present invention include hexachloro iridium complex salt such as $K_2IrCl_6$ and $K_3IrCl_6$, hexabromo iridium complex salt, hexaammine iridium complex salt, and pentachloro nitrosyl iridium complex salt.

Examples of the ruthenium compound for use in the present invention include hexachlororuthenium, pentachloro nitrosyl ruthenium, or $K_4[Ru(CN)_6]$.

Examples of the iron compound for use in the present invention include potassium hexacyano ferrate (II) and ferrous thiocyanate.

Ruthenium and osmium for use in the present invention can be added in the form of water-soluble complex salts, as described, for example, in JP-A-63-2042, JP-A-1-285941, JP-A-2-20852, and JP-A-2-20855. Among these, particularly preferred are hexa-coordination metal complexes represented by the following formula:

$$[ML_6]^{-n}$$

Wherein M represents Ru or Os, and n represents 0, 1, 2, 3, or 4.

A counter ion for the above-described complex is not so important, and can be an ammonium ion or an alkali metal ion. Further, preferable examples of the ligand include a halide ligand, a cyanide ligand, a cyanate ligand, a nitrosyl ligand, and a thionitrosyl ligand. Specific examples of the complex for use in the present invention are illustrated below, but they are not intended to limit the scope of the present invention.

$[RuCl_6]^{-3}$, $[RuCl_4(H_2O)_2]^{-1}$, $[RuCl_5(NO)]^{-2}$, $[RuBr_5(NS)]^{-2}$, $[Ru(CO)_3Cl_3]^{-2}$, $[Ru(CO)Cl_5]^{-2}$, $[Ru(CO)Br_5]^{-2}$, $[OsCl_6]^{-3}$, $[OsCl_5(NO)]^{-2}$, $[Os(NO)(CN)_5]^{-2}$, $[Os(NS)Br_5]^{-2}$, $[Os(CN)_6]^{-4}$, $[Os(O)_2(CN)_5]^{-4}$.

The addition amount of these compounds is preferably from $10^{-10}$ mol to $10^{-2}$ mol, and especially from $10^{-9}$ mol to $10^{-3}$ mol, per one mol of silver halide.

Also in the present invention, silver halide containing a Pd (II) ion and/or a Pd metal can be employed advantageously. Pd may be uniformly distributed within a silver halide grain, but is preferably included in the vicinity of a surface layer of the silver halide grain. The expression that Pd is "included in the vicinity of a surface layer of the silver halide grain" means that the silver halide grain has a layer with a higher palladium content than other layers, within a depth of 50 nm from the surface of the silver halide grain.

Such silver halide grain can be prepared by adding Pd in the course of formation of the silver halide grain, and it is preferable to add Pd after silver ions and halogen ions are added by more than 50% of the total addition amounts. Also Pd (II) ions may be advantageously included in the surface layer of silver halide by adding Pd (II) ions in a post-ripening stage.

Such Pd-containing silver halide grains increases a speed of a physical development or an electroless plating to improve the production efficiency of the desired electromagnetic shield material, thereby contributing to a reduction of the production cost. Pd is well known and employed as a catalyst for an electroless plating, and, in the present invention, it is possible to locate Pd in the surface layer of the silver halide grains, thereby saving extremely expensive Pd.

In the present invention, Pd ions and/or Pd metal preferably has a content, in the silver halide, of $10^{-4}$ to 0.5 mole/mol.Ag., more preferably 0.01 to 0.3 mole/mol.Ag., with respect to a number of moles of silver in the silver halide.

The Pd compound to be employed can be, for example, $PdCl_4$ or $Na_2PdCl_4$.

The silver halide emulsion for use in the present invention is preferably subjected to chemical sensitization, to increase the sensitivity as the photodetector. The chemical sensitization may be performed using a known method, for example sulfur sensitization, selenium sensitization, chalcogen sensitization such as tellurium sensitization, noble metal sensitization such as gold sensitization, and reduction sensitization. These sensitization methods may be used individually or in combination. When these sensitization methods are used in combination, a combination of sulfur sensitization and gold sensitization; a combination of sulfur sensitization, selenium sensitization, and gold sensitization; and a combination of sulfur sensitization, tellurium sensitization, and gold sensitization, are preferred.

The sulfur sensitization for use in the present invention is usually performed by adding a sulfur sensitizer and stirring the emulsion at a high temperature of 40° C. or higher for a predetermined length of time. The sulfur sensitizer to be used may be a known compound, and examples thereof include, in addition to the sulfur compound contained in gelatin, various sulfur compounds such as thiosulfates, thioureas, thiazoles, and rhodanines. Preferred sulfur compounds are a thiosulfate and a thiourea compound. The addition amount of the sulfur sensitizer varies depending on various conditions, such as the pH and the temperature at the time of chemical ripening and the size of silver halide grains, but it is preferably from $10^{-7}$ mol to $10^{-2}$ mol, more preferably from $10^{-5}$ mol to $10^{-3}$ mol, per one mol of silver halide.

The selenium sensitizer for use in the present invention may be a known selenium compound. The selenium sensitization is generally performed by adding a labile and/or non-labile selenium compound and stirring the emulsion at a high temperature of 40° C. or higher for a predetermined length of time. Examples of the labile selenium compound include the compounds described in JP-B-44-15748, JP-B-43-13489, JP-A-4-109240, JP-A-4-324855, and among these, particularly preferred are the compounds represented by formula (VIII) or (IX) in JP-A-4-324855.

The tellurium sensitizer for use in the present invention is a compound for forming silver telluride, which is presumed to become a sensitization nucleus, on the surface of or inside a silver halide grain. The formation rate of silver telluride in a silver halide emulsion can be examined according to a method described in JP-A-5-313284. Specific examples of the tellurium sensitizer to be used include the compounds described in U.S. Pat. Nos. 1,623,499, 3,320,069, and 3,772,031, British Patents No. 235,211, No. 1,121,496, No. 1,295,462, and No. 1,396,696, Canadian Patent No. 800,958, JP-A-4-204640, JP-A-4-271341, JP-A-4-333043, JP-A-5-303157, J. Chem. Soc. Chem. Commun., 635 (1980); ibid., 1102 (1979); ibid., 645 (1979); J. Chem. Soc. Perkin. Trans., 1, 2191 (1980); edited by S. Patai (compiler), The Chemistry of Organic Serenium and Tellunium Compounds, Vol. 1 (1986); and ibid., Vol. 2 (1987). The compounds represented by formulae (II), (III), and (IV) in JP-A-5-313284 are particularly preferred.

The amount to be used of the selenium sensitizer or tellurium sensitizer for use in the present invention varies depending on the silver halide grains to be used or the chemical ripening conditions, but it is generally from in the order of $10^{-8}$ mol to $10^{-2}$ mol, preferably from $10^{-7}$ mol to $10^{-3}$ mol, per one mol of silver halide. The conditions of chemical sensitization in the present invention are not particularly limited, but the pH is generally from 5 to 8, the pAg is generally from 6 to 11 and preferably from 7 to 10, and the temperature is generally from 40° C. to 95° C. and preferably from 45° C. to 85° C.

Examples of the noble metal sensitizer for use in the present invention include gold, platinum, palladium, and iridium, and gold sensitization is particularly preferred. Specific examples of the gold sensitizer for use in the present invention include chloroauric acid, potassium chloroaurate, potassium auric thiocyanate, gold sulfide, gold thioglucose(I), and gold thiomannose(I). The gold sensitizer can be used in an amount of approximately from $10^{-7}$ mol to $10^{-2}$ mol per one mol of silver halide. In the silver halide emulsion for use in the present invention, a cadmium salt, a sulfite, a lead salt, or a thallium salt may be present together during formation or physical ripening of silver halide grains.

In the present invention, reduction sensitization may be used. Examples of the reduction sensitizer to be used include stannous salts, amines, formamidinesulfinic acid, and silane compounds. To the silver halide emulsion for use in the present invention, a thiosulfonic acid compound may be added, according to the method described in European Unexamined Patent Publication No. 293,917. As the silver halide emulsion in the light-sensitive material for use in the present invention, only one type of emulsion may be used or two or more types (for example, those different in average grain size, in halogen composition, in crystal habit, in condition of chemical sensitization, or in sensitivity) may be used together. To obtain, particularly, high contrast, it is preferable that the emulsion becomes more sensitive as it closes to the support, as described in JP-A-6-324426.

Note that there is no limit to coating amount of the silver halide emulsion. Although too much coating amount of the emulsion causes the high cost of the photosensitive material and needs long time for exposure, the larger amount of silver halide emulsion is advantageous in forming developed silver with lower resistance value. The coating amount of the silver halide emulsion as the silver salt photosensitive material for the conductive film is preferably in a range of 2 g/m$^2$ to 15 g/m$^2$, more preferably in a range of 4 g/m$^2$ to 10 g/m$^2$, in volume of silver.

<Binder>

The emulsion layer can employ a binder for the purposes of uniformly dispersing the silver salt grains and assisting an adhesion between the emulsion layer and the substrate. The binder in the present invention can be a water-insoluble binder or a water-soluble binder, but a water-soluble binder is preferred.

Such binder can be, for example, gelatin, polyvinyl alcohol (PVA), polyvinylpyrrolidone (PVP), a polysaccharide such as starch, cellulose and a derivative thereof, polyethylene oxide, a polysaccharide, a polyvinylamine, chitosan, polylysine, polyacrylic acid, polyalginic acid, polyhyaluronic acid, or carboxycellulose. These materials have a neutral, anionic or cationic property depending on the ionic property of the functional group.

An amount of the binder contained in the emulsion layer is not particularly limited, and can be suitably selected within a range of meeting the dispersibility and the adhesion. The larger ratio of binder in the emulsion layer has the advantage in forming developed silver with lower resistance value. However, too much Ag/binder ratio causes aggregation of silver halide particles and worse coating properties. The amount of the binder in the emulsion layer in a Ag/binder weight ratio is preferably at least 3, more preferably in a range of 4.5 to 12, further preferably in a range of 6 to 10. As the binder, gelatin is most preferable to be used.

<Hardener>

The emulsion layer and other hydrophilic colloid layers in the photosensitive material of the present invention are preferably harden by hardener.

As the hardener, organic or inorganic gelatin hardeners can be used alone or in combination. As the gelatin hardeners, for example there are active vinyl compounds such as 1,3,5-triacryloyl-hexahydro-s-triazine, bis(vinylsulfonyl)methyl ether, N,N'-methylenebis-[β-(vinylsulfonyl) propionamide] and so on, active halogen compounds such as 2,4-dichloro-6-hydroxy-s-triazine and so on, mucohalogenic acids such as mucochloric acid and so on, N-carbamoylpyridinium salts such as (1-morpholinocarbonyl-3-pyridinio)methanesulfonate and so on, haloamidinium salts such as 1-(1-chloro-1-pyridinomethylene)pyrrolidinium 2-naphthalenesulfonate and so on. In particular, active vinyl compounds disclosed in JP-B-53-41220, JP-B-53-57257, JP-B-59-162546 and JP-B-60-80846, and active halogen compounds disclosed in U.S. Pat. No. 3,325,287 are preferred over others. Major examples of the gelatin hardener are shown below.

[Chemical formula 1]

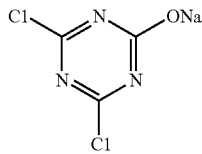
H-1

H-2

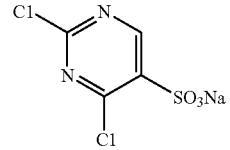
H-3

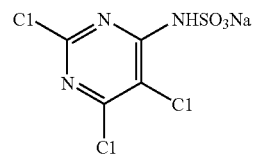
H-4

[Chemical formula 2]

H-5

H-6

H-7

H-8

H-9

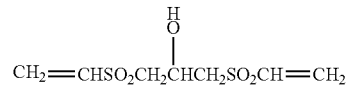
H-10

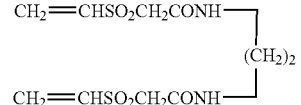
H-11

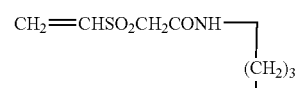
H-12

[Chemical formula 3]

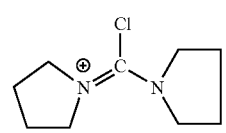
H-13

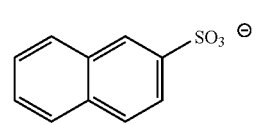

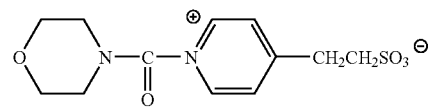
H-14

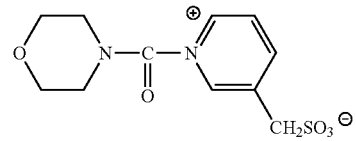
H-15

H-16

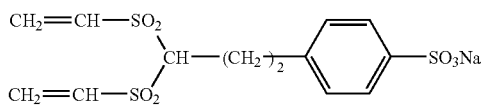

As described above, the degree of swelling of the emulsion layer can be controlled by changing amount of the hardener in the emulsion layer.

The preferable amount of the hardener in the emulsion layer cannot be defined in a fixed value, because it varies according to storage temperature and humidity of the photosensitive material after adding the hardener, storage period, a film pH of the photosensitive material and an amount of the binder in the photosensitive material. Especially, since the hardener is diffusible in the whole layers on one surface of the photosensitive material before reacting with the binder, the preferable amount of the hardener depends on the total amount of the binder on one surface of the photosensitive material including the emulsion layer. In the present invention, the content of the hardener in the photosensitive material is preferably in a range of 0.2 mass % to 15 mass %, more preferably in a range of 0.5 mass % to 6 mass % to the total amount of the binder on one surface of the photosensitive material.

In addition, since the hardener is diffusible as descried above, the hardener may be added to any layer on the same surface of the photosensitive material where the emulsion layer exists, or may be added in plural layers after the above preferable amount thereof is portioned into plural pieces.

<Dye>

The photosensitive material contains a dye at least in the emulsion layer. Such dye is included in the emulsion layer as a filter dye, or for various purposes such as prevention of irradiation. The dye may include a solid dispersed dye. Dyes preferably employed in the present invention include those represented by general formulas FA, FA1, FA2 and FA3 in JP-A-9-179243, more specifically compounds F1-F34 described therein. Also there can be advantageously employed compounds (II-2)-(II-24) described in JP-A-7-152112, those-(III-5)—(III-18) described in JP-A-7-152112 and those (IV-2)-(IV-7) described in JP-A-7-152112.

Also the dyes employable in the present invention include, as a dye dispersed in solid fine particles to be discolored at the developing or fixing process, a cyanine dye, a pyrilium dye and an aminium dye described in JP-A-3-138640. Also as a dye not discolored at the processing, there can be employed a cyanine dye having a carboxyl group described in JP-A-9-96891, a cyanine dye not containing an acidic group described in JP-A-8-245902 and a lake cyanine dye described in JP-A-8-333519, a cyanine dye described in JP-A-1-266536, a holopolar cyanine dye described in JP-A-3-136038, a pyrilium dye described in JP-A-62-299959, a polymer cyanine dye described in JP-A-7-253639, a solid particle dispersion of an oxonol dye described in JP-A-2-282244, light scattering particles described in JP-A-63-131135, a Yb<3+> compound described in JP-A-9-5913 and an ITO powder described in JP-A-7-113072. There can also be employed dyes represented by general formulas F1 and F2 described in JP-A-9-179243, more specifically compounds F35-F112 therein.

Also a water-soluble dye may be contained as the aforementioned dye. Such water-soluble dye can be an oxonol dye, a benzylidene dye, a merocyanine dye, a cyanine dye or an azo dye. Among these, an oxonol dye, a hemioxonol dye or a benzylidene is useful in the present invention. Specific examples of the water-soluble dye employable in the present invention include those described in British Patent No. 584,609 and No. 1,177,429, JP-A-48-85130, JP-A-49-99620, JP-A-49-114420, JP-A-52-20822, JP-A-59-154439, and JP-A-59-208548, U.S. Pat. Nos. 2,274,782, 2,533,472, 2,956,879, 3,148,187, 3,177,078, 3,247,127, 3,540,887, 3,575,704, 3,653,905 and No. 3,718,427.

In the emulsion layer, the dye preferably has a content of 0.01 mass % to 10 mass %, more preferably 0.1 mass % to 5 mass % to the total solid, in consideration of an irradiation preventing effect and a reduction in the sensitivity by an increase in the content.

<Solvent>

A solvent to be employed in forming the emulsion layer is not particularly limited, and can be, for example, water, organic solvent (for example alcohol such as methanol, ketones such as acetone, amide such as formamide, sulfoxide such as dimethyl sulfoxide, ester such as ethyl acetate, or ether), ionic liquid or mixture thereof.

In the emulsion layer of the present invention, the solvent is employed in an amount within a range of 30-90 mass % preferably within a range of 50-80 mass % with respect to the total mass of the silver salt, the binder and the like contained in the emulsion layer.

[Substrate]

A substrate for the photosensitive material to be employed in the producing method of the present invention can be, for example, a plastic film, a plastic plate or a glass plate.

A raw material for the plastic film or the plastic plate can be, for example, polyester such as polyethylene terephthalate (PET), or polyethylene naphthalate; polyolefin such as polyethylene (PE), polypropylene (PP), polystyrene or EVA; vinylic resin such as polyvinyl chloride, or polyvinylidene chloride; polyether ether ketone (PEEK), polysulfone (PSF), polyethersulfone (PES), polycarbonate (PC), polyamide, polyimide, acrylic resin, or triacetyl cellulose (TAC).

In the present invention, the plastic film is preferably a polyethylene terephthalate film in consideration of transparency, heat resistance, easy of handling and cost.

When the conductive metal layer obtained by the present invention is used as the electromagnetic shielding member for display devices, it is preferable that the substrate is a transparent material such as a transparent plastic. In such case, the plastic film or the plastic plate preferably has a transmittance in the entire visible region of 70-100%, more preferably 85-100% and particularly preferably 90-100%.

Also in the present invention, the substrate may be colored. In addition, the substrate may be a single layered or a multi-layered film by combining two or more layers.

In case of employing a glass plate as the substrate in the present invention, the type of glass is not particularly limited. However, when the conductive metal layer obtained by the present invention is used as the electromagnetic shielding member for display devices, a tempered glass having a tempered layer on the surface is preferable. The tempered glass is much durable to breakage in comparison with an untempered glass. Also the tempered glass obtained by an air cooling method will break, even if it breaks, into small fragments with unsharp edges, and is preferable for safety.

[Forming Photosensitive Material]

The photosensitive material of the present invention can be formed by coating emulsion layer coating liquid containing above contents. Any method can be used for the coating.

The coated emulsion layer preferably has pH of 3.0 to 9.0, more preferably has pH of 4.0 to 7.0, to achieve the above-described degree of swelling. In the present invention, the pH of the emulsion layer is defined as a pH value detected at 25° C. read out through surface electrodes connected to the coated film which has been left for one minute after a 20 μl distilled water drop is placed on its surface. In addition, moisture content of the emulsion layer is preferably no more than 50 wt. %, more preferably in a range of 5 wt. % to 30 wt. % to the total binder amount on the emulsion layer.

The photosensitive material of the present invention may have other functional layers in addition to the emulsion layer. As the functional layers, for example there are a protective layer, a UL layer and a subbing layer on the emulsion layer side, and a backing layer on the other side (with no emulsion layer) of the photosensitive material.

It is preferable that the emulsion layer is a substantially-uppermost layer. "The emulsion layer is a substantially-uppermost layer" means that the emulsion layer is actually an uppermost layer or a total thickness of layers on the emulsion layer is no more than 0.5 μm. The total thickness of the layers on the emulsion layer is preferably no more than 0.2 μm. Although the thickness of the emulsion layer is not limited, it is preferably in a range of 0.2 μm to 20 μm, more preferably in a range of 0.5 μm to 5 μm.

The exposure section 13 is composed of for example an exposure roller 28 having a diameter De of 150 mm, a photomask 29 disposed above the exposure roller 28, and a illuminating section 30 for illuminating the photomask 29. As shown in FIG. 5A and FIG. 5B, the photomask 29 comprises for example a mask substrate 32 formed of a transparent soda glass having a thickness $t_2$ of 4.5 mm, a mask length (in the work conveying direction F) Lm of 200 mm and a mask width Wm of 800 mm, and a plurality of mask patterns 33 arranged along the work conveying direction F on one surface of the mask substrate 32.

The mask pattern 33 is formed of for example slits on a light shielding pattern of black. The slits shape the mask pattern 33 along the width direction and allow transmission of light. Note that although the shieling pattern is black and the mask pattern 33 (slits) is white actually, the shielding pattern is drawn in white and the mask pattern is drawn in black in FIG. 5A, in consideration of viewability of the figure.

As shown in FIG. 5C, the mask pattern 33 has the shape and size same as the mesh of the periodic pattern 5 described above, and is formed on the mask substrate 32 along the work width direction by chrome deposition. A plurality of the mask patterns 33 are arranged along the work conveying direction F in a pattern area 35 on the mask substrate 32. For example, the pattern area 35 has a pattern length (in the work conveying direction F) L of 200 mm and a pattern width (in the work width direction) W of 760 mm. Although the work width $W_0$ and the pattern width W are not limited to above-described value, it is preferable that a relation between the work width $W_0$ and the pattern width W satisfies $W_0 < W$ to surely expose the periodic pattern 5 on the belt-like work 11 even when the work 11 meanders during convenance.

To expose the mask pattern 33 as the periodic pattern 5 on the belt-like work 11, it is preferable that a relation between the period length $L_0$ and the pattern length L satisfies $L_0 < L$. In this embodiment, although the pattern length L of 200 mm is considerably larger than the period length $L_0$ of 424 μm for ensuring stiffness of the photomask 29 to prevent twist of the image caused by bend of the photomask 29 or the like, the pattern length L can be shorter for cost-cutting as long as the structure of the photomask 29 has the sufficient stiffness. For example, when a plurality of the periodic patterns are formed across a soda glass substrate of 800×1000 mm and then the substrate is cut into plural strips (masks), the plural masks are formed at low cost only by a single mask preparation process and the cutting process.

When the pattern length L of the mask pattern 33 is sufficiently larger than the minimal period length $L_0$ for the exposure of the periodic pattern 5, even if the photomask 29 is damaged by operational error or the like, it can be still used after shifted at least the period length $L_0$ in the work conveying direction F. In this case, since an extra (backup) photomask is not needed, the cost performance can be increased.

The slit width of the mask pattern 33 is preferably nallower than the desired line width Wp of the periodic pattern 5, in consideration of line broadening effect by proximity exposure. In addition, although the alignment angle θp, the spacing pitch P and the line width Wp are not limited to the above-described value, the pattern 5 needs to be a periodic pattern in the work conveying direction F.

Figure 6:
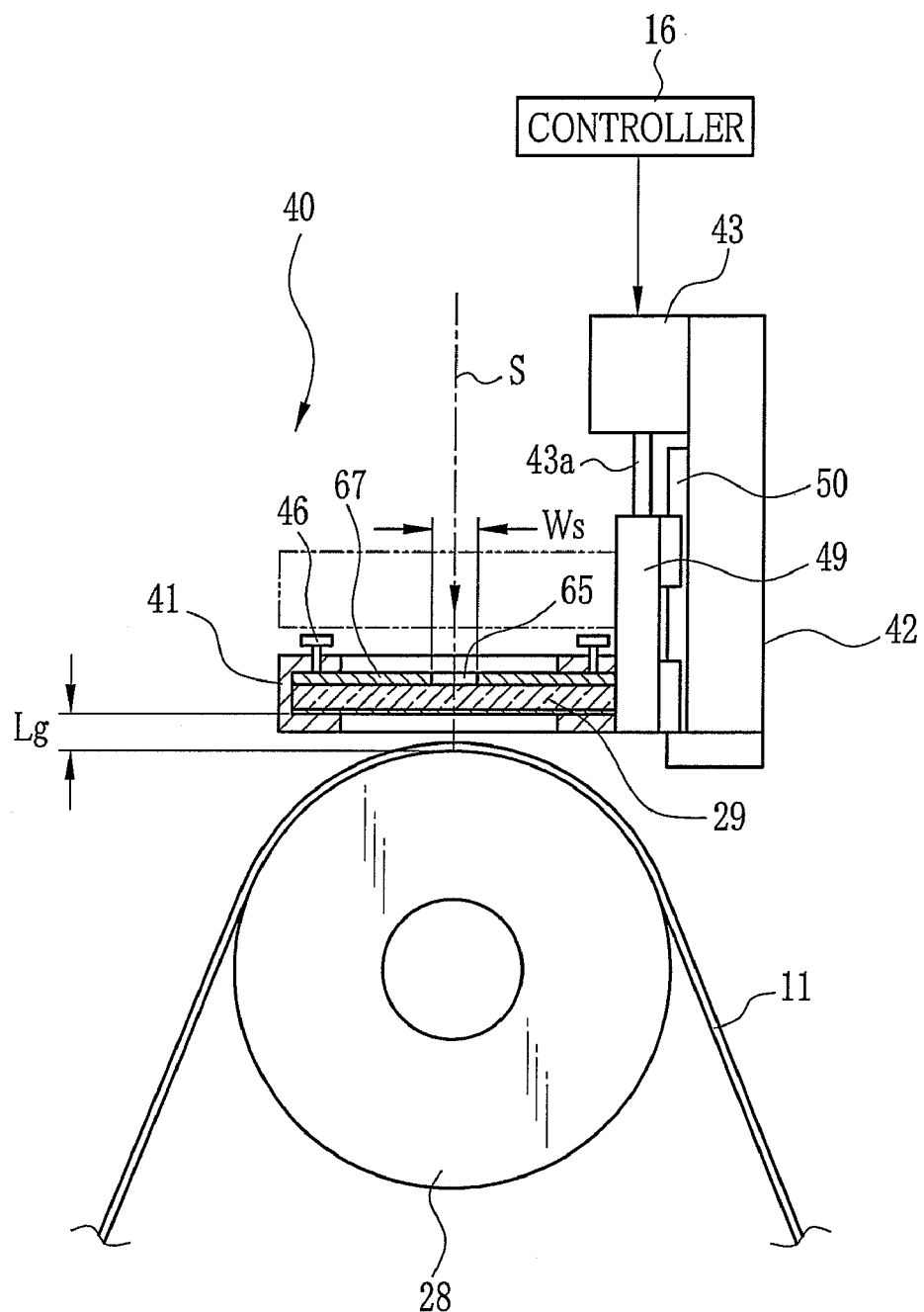
FIG. 6 is a schematic view showing construction of a mask holding section.

The photomask 29 is held by a mask holding section 40 shown in FIG. 6. The mask holding section 40 is composed of a holding frame 41 for holding the photomask 29, a support 42 for supporting the holding frame 41 movably between an exposing position where the photomask 29 held by the holding frame 41 faces the belt-like work 11 through a proximity gap Lg and a retreat position (shown by chain double-dashed line in the figure) where the gap between the photomask 29 and the belt-like work 11 is larger than the proximity gap Lg, and an actuator 43 as a driver for moving the holding frame 41 between the exposing position and the retreat position. In this embodiment, the proximity gap Lg is for example 50 μm.

The holding frame 41 holds the outer periphery of the photomask 29 by sandwiching it from forward and backward along the work conveying direction F. The holding frame 41 is provided with a plurality of adjustment screws 46 arranged along the width direction, which are screwed from the back side (light source side) of the holding frame to contact the photomask 29. The adjustment screw 46 performs fine adjustment for correcting small strain of the proximity gap Lg in the width direction. When the screw amount of each screw 46 to the holding frame 41 is changed, the position of the photomask 29 in contact with the screw in the holding frame 41 is also changed according to the screw amount. The photomask 29 is moved in the holding frame 41 such that the proximity gap Lg is adjusted to be constant along the width direction.

The support 42 is composed of a slide guide 49 attached to the holding frame 41, and a slide rail 50 slidably supporting the slide guide 49, so as to slidably hold the holding frame 41 between the exposing position and the retreat position. As the actuator 43, for example a motor, a solenoid and an air cylinder can be used. The actuator 43 slides the holding frame 41 on the slide rail 50 between the exposing position and the retreat position. The proximity gap Lg is determined by fine adjustment of a stopper which determines the exposing position on the slide rail 50.

The actuator 43 is attached to the support 42, and a mover 43a is connected to the slide guide 49. Movement of the actuator 43 is controlled by the controller 16. The actuator 43 pushes the mover 43a downward to move the holding frame 41 toward the exposing position for starting the exposure. When the joint of the belt-like work 11 passes under the photomask 29, the actuator 43 pulls the mover 43a upward to move the holding frame 41 toward the retreat position for preventing contact of the joint and the photomask 29. The retreat position is for example 50 mm away from the expositing position to surely prevent the contact to the joint. Note that since the support 42 used in the present invention has a high accuracy of positional reproducibility in the movement toward the exposing position, the proximity gap Lg does not become out of alignment by the movement of the holding frame 41.

Figure 7:
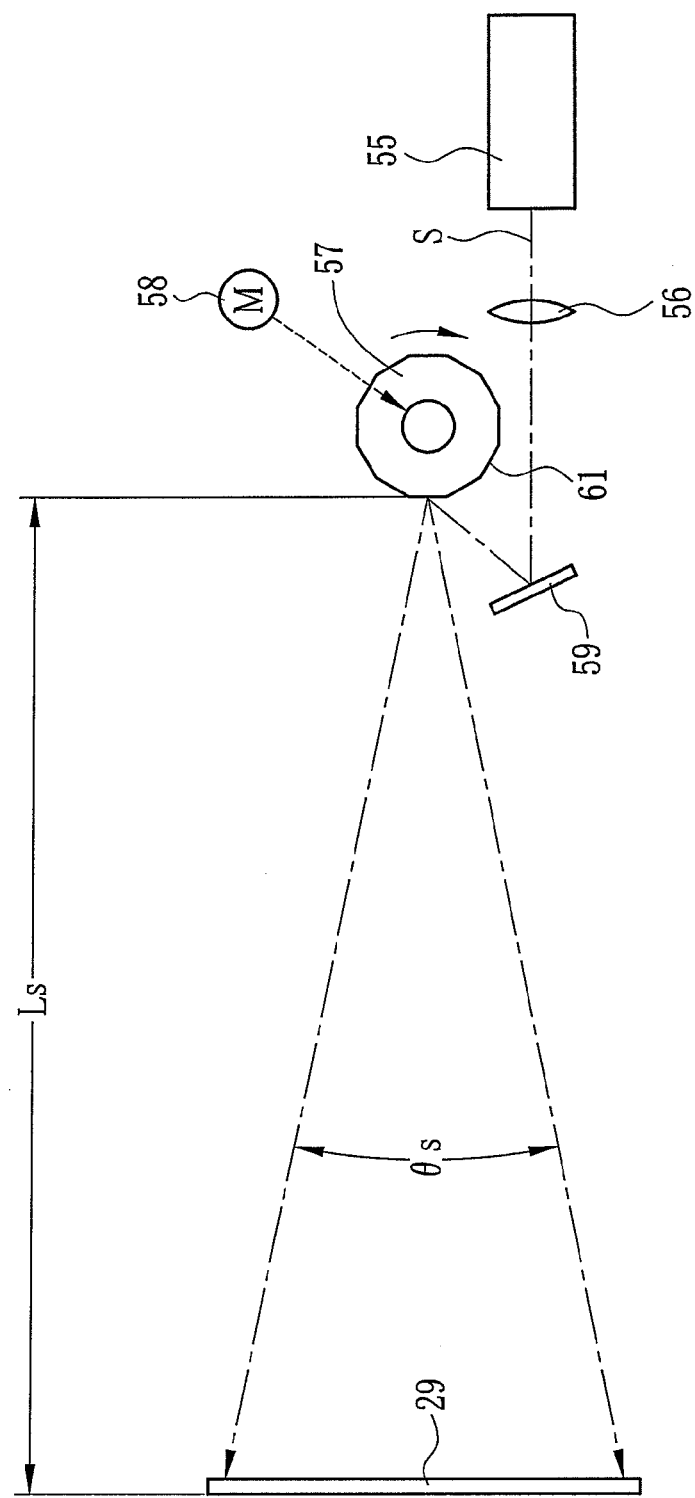
FIG. 7 is a schematic view showing construction of an illuminating section.

As shown in FIG. 7, the illuminating section 30 is composed of a laser emitter 55 as the exposure light source, a collimating lens 56 for collimating laser beam S emitted from the laser emitter 55 to parallel light, a reflecting mirror 59 for reflecting the laser beam S, and a polygon mirror 57 and a motor 58 as a scanner.

Figure 8:
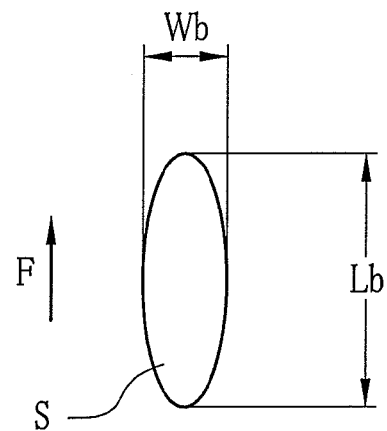
FIG. 8 is an explanatory view showing a projection shape of a laser beam.

The laser emitter 55 is for example a single-mode semiconductor laser emitter with 60 mW output, which emits laser beam S of 405 nm wavelength. The collimating lens 56 has for example a focal length of 3 mm, and converts the laser beam S into collimated light having a projection shape of an elipse whose long axis Lb is 3.6 mm length and short axis Wb is 1.2 mm length, as shown in FIG. 8. The laser beam S illuminates the photomask 29 such that the long axis Lb follows the work conveying direction F and the short axis Wb follows the work width direction. Note that although the projection shape and size of the laser beam S is shown in $1/e^2$ equivalent beam diameter, these are not limited to above and may be freely configured by the collimating lens 56.

The polygon mirror 57 has a plurality of flat reflecting surfaces 61 on a side peripheral surface of a rotational disc. The reflecting surface 61 reflects the laser beam S entered thereto to the photomask 29 while being rotated by the motor 58, to scan the laser beam S on the photomask 29. In this embodiment, there are eighteen reflecting surfaces 61 on the polygon mirror 57. A maximum scan angle, which is an angle able to be scanned by the reflecting surface 61, is 20° in this configuration. However, a scan angle θs, which is actually used for the scanning, is 10° in this embodiment. To scan the whole of the photomask 29 in the width direction by the scan angle θs of 10°, a distance Ls between the reflecting surface 61 to the photomask 29 is set to 2250 mm.

The reason for determining the scan angle θs to 10° is for reducing fluctuation of exposing time through use of the polygon mirror 57. In the polygon mirror 57, there is a difference between a radius, which is from the rotational center to the edge of the reflecting surface 61, and a radius, which is from the rotational center to the center of the reflecting surface 61. Accordingly, an angular speed is varied (scan speed is varied) to fluctuate the exposing time, and as a result, the exposure quality degrades. For example, when the scan angle θs is 10°, the difference of the scan speed between at the center and at the edge of the reflecting surface 61 becomes 3.1%, and such small difference hardly affects the exposure of the periodic pattern 5. However, when the scan angle θs is 20°, the difference of the scan speed becomes 13.2%, and when the scan angle θs is 45°, the difference of the scan speed becomes 50%. In these conditions, a defective exposure such as unevenness of line width and pitch of the periodic pattern 5 may be caused.

In case that the distance between the illuminating section 30 and the photomask 29 is shortened to downsize the pattern exposure apparatus 10, it is preferable that power of the laser beam S is changeably controlled to adopt to the change of the scan speed of the polygon mirror 57. The density of the silver salt photosensitive material 21 is determined by an accumulated exposure amount (total amount of the exposure) which is multiplication of total exposure time and exposure light intensity. Accordingly, by changing the power (intensity) of the laser beam S such that the accumulated exposure amount is kept constant, the periodic pattern 5 can be exposed without degradation of the exposure quality.

The reason for that the number of the reflacting surfaces 61 of the polygon mirror 57 is eighteen, is to keep the diameter of the polygon mirror 57 to approximately 100 mm. When only the scan angle θs of 10° is used while the maximum scan angle is 20° in the polygon mirror 57, a use efficiency of the exposure light source becomes 50%. To obtain sufficient exposure amount in this condition, the intensity of the exposure light source needs to be high, which is a disadvantage in cost. However, if the number of the reflacting surfaces 61 of the polygon mirror 57 is thirty-six to increase the use efficiency of the exposure light source, the diameter of the polygon mirror 57 becomes at least 600 mm, which needs impractically high cost for manufacturing. Accordingly, the polygon mirror 57 with the eighteen reflacting surfaces 61 is used in this embodiment. Note that since the intensity of the exposure light source corresponds to the number of the reflacting surfaces 61 of the polygon mirror 57, it is preferable that the number of the reflacting surfaces is optimized according to a combination of the power of exposure light source and the sensitivity of the photosensitive material.

To perform the laser scanning, actuators such as galvano scanners and resonant scanners may be used instead of the polygon mirror. However, since the laser scanning needs to be performed in one direction as descrived below, a modulation control to cancel one direction of scan is needed when a two-way scan type actuator is used.

Figure 9:
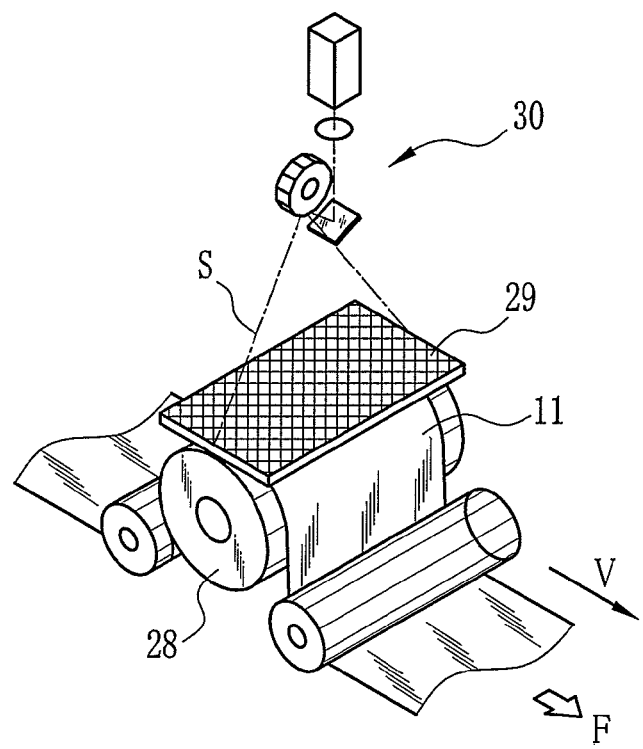
FIG. 9 is a schematic view showing a pattern exposure method of the present invention.

Next, a method for exposing the meshed periodic pattern 5 with use of the pattern exposure apparatus 10 of the above-described configuration will be described. As shown in FIG. 9, the belt-like work 11 is conveyed in the work conveying direction F. While the conveyance, the laser beam S is emitted from the illuminating section 30 toward the photomask 29. The laser beam S passes though the slit on the mask pattern 33 and then reaches the belt-like work 11 to expose the periodic pattern 5 of rhombus having the period length $L_0$ of 424 μm along the work conveying direction F. Between the belt-like work 11 and the photomask 29, the proximity gap Lg of for example 50 μm is provided. By performing the proximity exposure in synchronization with conveying the period length $L_0$ of the work 11, the periodic pattern 5 is exposed without deviation.

In the present invention, while the belt-like work 11 is continually conveyed and the photomask 29 with the mask pattern 33 stands still, an exposure area covering at least one period of the mask pattern 33 on the photomask 29 is subjected to the proximity exposure. The proximity exposure is periodical (one period corresponds to the conveyance of 424 μm). Accordingly, the exposure area covering at least one period of the mask pattern 33 means a minimum required area including a region of 424 μm in the conveying direction and 750 mm in the width direction which is needed to expose the one period of the periodic pattern 5.

When the period length $L_0$ is 424 μm in the conveyance direction of the periodic pattern 5, the work conveying speed V of the belt-like work 11 is 4 m/min, the exposure period for exposing the periodic pattern 5 is T, the exposure time is $T_{exp}$, and the minimum line width Dmin of the mask pattern 33 is 10 μm, the required time for conveying the period length $L_0$ of the belt-like work 11 becomes $L_0/V=6.36$ msec. When one scan is designed to perform in this time period, the exposure period T becomes 6.36 msec and the rotation speed of the polygon mirror 57 with eighteen reflecting surfaces becomes ω=524 rpm. In this case, the scan speed Vb becomes Ls·ω=123 m/sec because the distance Ls between the polygon mirror 57 and the photomask 29 is 2250 mm. Since the width of the projection shape of the laser beam is 1.2 mm, the exposure time $T_{exp}$ of the laser beam S at this scan speed Vb becomes 1.2/Vb=9.8 μsec, and the conveyance length Lc of the belt-like work 11 in this exposure time $T_{exp}$ becomes $V \cdot T_{exp} = 0.65$ μm.

The conveyance length Lc is a misalignment amount of the belt-like work 11 toward the photomask 29 in the conveyance direction F during the exposure. Accordingly, if the conveyance length Lc is larger than the minimum line width Dmin of the mask pattern 33, the line width Wp of the periodic pattern 5 becomes larger to decrease the exposure quality. To assure the good exposure quality, the relation $V \cdot T_{exp} <$ Dmin is required. In this embodiment, since the relation $V \cdot T_{exp} = 0.65$ μm<Dmin=10 μm is satisfied, the good exposure quality can be maintained.

In this embodiment, the projection shape of the laser beam S has the long axis Lb of 3.6 mm and the short axis Wb of 1.2 mm, and a light shielding mask 67, which includes a slit 65 having a width Ws approximately equal to the long axis Lb of the laser beam S, is provided on the back side of the photomask 29, to prevent that the photomask 29 is exposed in a width larger than the width Ws. Accordingly, the exposure area for one scan of the laser beam S has a size of 3.6 mm (in the conveying direction)×750 mm (in the width direction), which means that 3.6/0.424=8.5 pieces of the mask patterns 33 are exposed at the one scan, and each piece of the mask pattern 33 is subjected to multiple exposure.

The length of the light projected on the photomask from the exposure light source (Lb) is 3.6 mm as described above, which satisfies Lb=3.6>$L_0$=0.424. A quotient m of Lb/$L_0$ becomes 8. Accordingly, when the relation between the work conveying speed V and the exposure period T satisfies (n−1)×($L_0$/V)=T (n is a natural number) and 2≦n≦m=8, any number can be selected from 2 to 8 as n. When n=2, the number of times of the multiple exposure is maximized. In this embodiment, as described above, since the required time for conveying the period length $L_0$ of the belt-like work 11 is $L_0$/V=6.36 msec, and the one scan is performed in this time period, the relation between T and V is determined to satisfy T=6.36 msec and n=2.

As shown in (a) to (e) of FIG. 10A, the one scan of the laser beam S exposes 8.5 rows of the periodic pattern 5 from left to right through the photomask 29. As a result, as shown in (a) of FIG. 10B, on the belt-like work 11, 8,5 rows of rhombuses are exposed along the work conveying direction F. Since the belt-like work 11 is conveyed to the period length $L_0$ in the work conveying direction F while the one scan, the same pattern is over-exposed on the portion of the belt-like work 11 where the periodic pattern 5 has already been exposed through the photomask 29 when this portion passes below the photomask 29. At this time, the periodic pattern 5 can be over-exposed exactly on the former-exposed periodic pattern 5 if the work conveying speed V and the exposure period T are synchronized. By repeating this sequence, as shown in (a) to (g) of FIG. 10B, each rhombus of the periodic pattern 5 is exposed 8.5 times on the belt-like work 11. Note that at the start and end of the operation of the pattern exposure apparatus 10, there became portions of the belt-like work 11 where the number of times of the exposure is gradually decreased. These portions are withdrawn as NG portions.

Since 750 mm width of the photosensitive material moving at 4 m/min is exposed, an exposed area per unit time becomes 66.7 mm/sec (4 m/min)×750 mm=500 cm². When the sensitivity of the photosensitive material is 10 μj/cm², an exposure power of 5 mw=10 μj/cm²×500 cm² is needed. In addition, when the slit width (minimum line width) of the mask pattern is 15 μm, an aperture ratio is 9.75% (when the pitch P=300 μm), a scan efficiency is 50% and an efficiency of the optical system is 50%, a use efficiency of the exposure light source η becomes 0.5×0.5×0.0975=2.4%. To obtain 5 mw in one exposure with this use efficiency, 5/2.4%=208 mw of light source power is required.

In this embodiment, since the required exposure amount is an integration of each exposure amount in the multiple exposure, the light source power can be lowered than when obtaining required exposure amount at the single exposure. Note that the sensitivity of the photosensitive material (2 μj/cm² to 10 μj/cm²) and the light source power (50 mw to 200 mw) can be selected. It also may be that plural light sources of low power are combined to use as single light source of high power.

One advantage of the multiple exposure is to make up for insufficient light amount of the light source of low power by plural times of exposures, as described above. In addition, the multiple exposure can average the nonuniformity of brightness distribution of the light source in the conveying direction, and the nonuniformity of the exposure light amount in the conveying direction can be prevented. The scan in the width direction also can average the nonuniformity of brightness distribution of the light source in the width direction, and the nonuniformity of the exposure light amount in the width direction can be prevented. Accordingly, by the integration effect from the combination of the multiple exposure and the width direction scan, the exposure light amount is theoretically uniform all over the exposed area regardless of the brightness distribution of the light source. Since there is no need to manage the uniformity of the brightness distribution of the light source, the cost can be saved largely.

In the pattern exposure method of the present invention, the relation between the exposure period T and the work conveying speed V largely affects the uniformity of the exposed line width. When the exposure period T and the work conveying speed V are out of synchronization, the position for additional-exposure is misaligned from the former exposed position according to the amount of the desynchronization. In the direction of the long axis Lb of the laser beam S, the misalignment amount is accumulated through the 8.5 times exposures of the periodic pattern.

Figure 11:
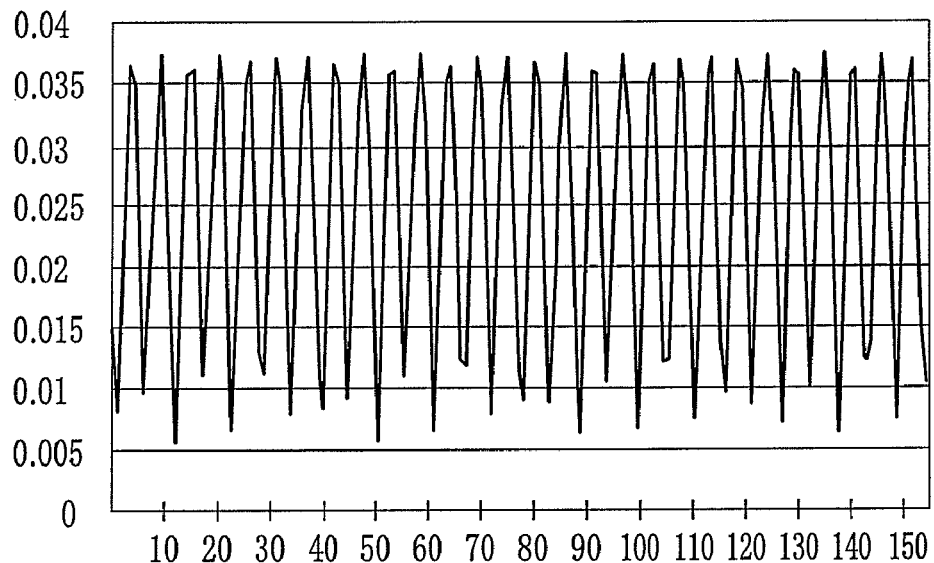
FIG. 11 is a graph showing deviation of exposure due to out-of-synchronization in scanning.

The accumulated misalignment amount of the additional-exposure is simulated under below conditions and the result is shown in FIG. 11.

Conditions for the Simulation
Work conveying speed V=4 m/min
Scanning frequency 1/6.36 msec=157 Hz
Conditions of the Drive System
1/50 worm reducer after the motor
Pulleys for further decelaration by 1:2 to drive the exposure roller
A gear mark as a maximum speed fluctuation component (component by one tooth of the gear: same as a frequency component of one rotation of an input axis)
A maximum deviation value of misalignment of the scan position (in the work conveying direction) in the 8 times of scan is simulated
A speed fluctuation of the gear mark is presumed as 1%

As a result of the simulation, it is found that when 8.5 times of exposures are performed with 1% speed fluctuation of the gear mark, the maximum deviation value of misalignment becomes 37 μm. Accordingly, the speed fluctuation is preferably reduced to approximately 0.1%, by controlling the synchronization of the movements in the apparatus. In addition, if the projection shape of the laser beam is designed to be small, the effect of the speed fluctuation can be reduced. However, in this case the more exposure light power is needed because the number of multiple exposure becomes smaller. Accordingly, the design for reducing the misalignment in the additional-exposure needs to be balanced in view of the sensitivity of the photosensitive material and the cost for the apparatus.

In this embodiment, the exposure amount is designed such that the density of the photosensitive material is approximately zero after the first exposure, the density reaches approximately half of the desired value after the second exposure, and the density reaches approximaterly the desired value after the third and fourth exposures. This design is deeply related to the high contrast photosensitive material having the large value of γ. For such exposure, γ of the photosensitive material is preferably at least 5, more preferably at least 10. In this embodiment, the photosensitive material has γ of at least 20, and has a property that γ is larger (high contrast) in smaller time of the exposure. This property is suitable for above-described multiple exposure.

The brightness distribution of the exposure light source generally shows Gaussian distribution, and an area having sufficient brightness for the exposure covers only approximately 4 periods in the center of 8.5 periods of the periodic pattern to be exposed. Accordingly, the process of the multiple exposure is composed of substantially 4 times of exposures. In this multiple exposure, a latent image is formed when the accumulated exposure amount reaches a certain level while the 4 times of exposures. Since the latent image is not formed by a single exposure, undesired latent images are not formed even if the misalignment in the additional-exposure is occurred, unless the accumulated exposure amount on the misaligned portion reaches the certain level. Although some misalignment in the additional-exposure is inevitably occurred because the belt-like work 11 is being conveyed during exposure, the generation of undesired latent images can be prevented by keeping the accumulated exposure amount on the misaligned portion sufficiently small. Accordingly, the misalignment in the multiple exposure is not visualized.

On the other hand, the scanning of the laser beam S leads to vary the exposure amount. However, this does not affect on the pattern shape because the laser beam S always passes through the photomask 29. Even if the variation of the exposure amount is caused by the scanning of the laser beam S, the total exposure amount is averaged by the multiple exposure. Accordingly, the line width is hardly affected. It is the advantage of the present invention that steady exposure quality can be obtained even if there are fluctuation of the polygon mirror 57 and low accuracy of angle of each reflecting surface 61.

In the proximity exposure, the proximity gap Lg is preferably no more than 500 μm. From an experiment, it was found that in the proximity exposure the exposed line width becomes slightly wider than the line width of the photomask by diffraction of light even when the collimated light is used, while in the contact exposure the exposed line width becomes same to the line width of the photomask. Simulation results of light intensity distributions, caused by light diffraction when the proximity gap Lg varies 50 μm to 550 μm, are shown in FIG. 12A to FIG. 12F. From the results, it is found that the larger the proximity gap Lg is, the wider the light intensity distribution is. In addition, when the shape of the exposed pattern is checked with the gap being increased, it is found that the larger the proximity gap Lg is, the larger the deformation on orthogonal points of the lines is. Accordingly, the proximity gap Lg is preferably no more than 500 μm. In this embodiment, the proximity gap Lg is 50 μm because the smaller the proximity gap Lg becomes, the better the exposure quality becomes (a reason for that the gap cannot be less than 50 μm is described later).

Figure 13:
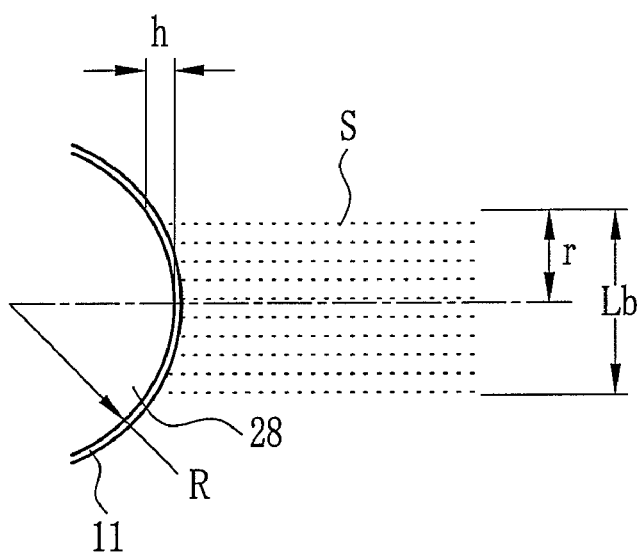
FIG. 13 is an explanatory view showing difference of the proximity gap according to its position on an exposure roller.
Figure 12A:
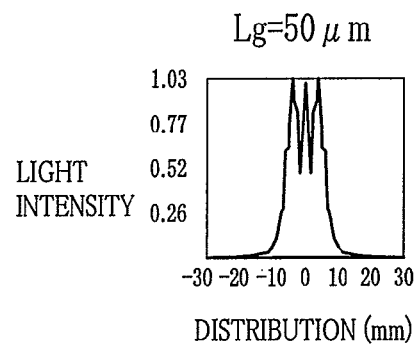
FIG. 12A to FIG. 12F are graphes showing a relation between proximity gap and light intensity distribution.
Figure 12B:
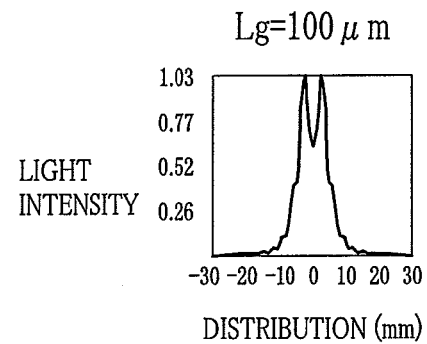
Figure 12C:
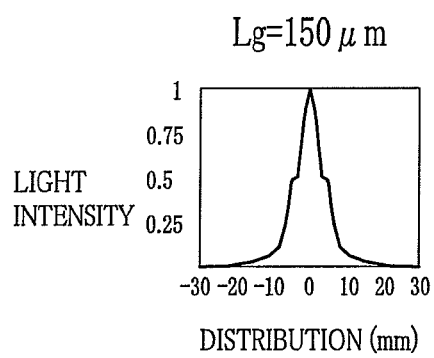
Figure 12D:
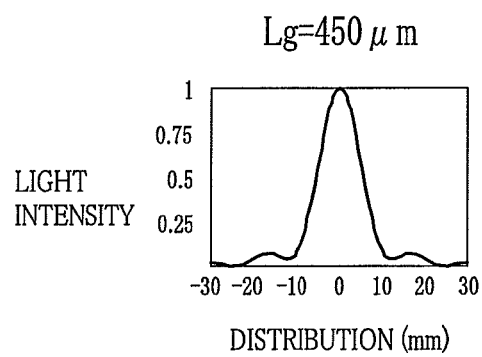
Figure 12E:
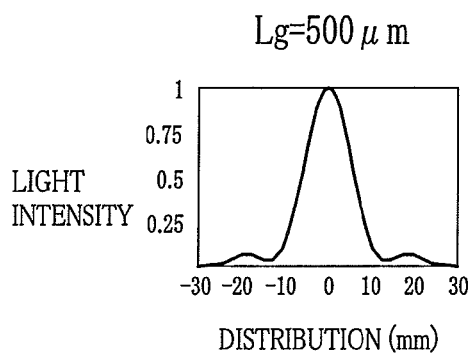
Figure 12F:
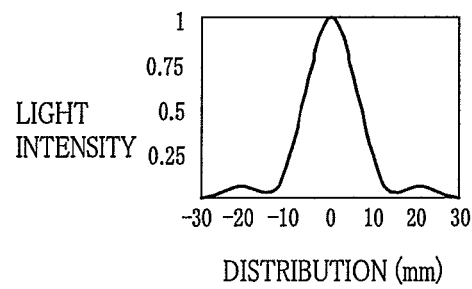

In this embodiment, the exposure section 13 is above the exposure roller 28 with Ø150 mm, and the exposure is performed while the belt-like work 11 wrapped on the exposure roller 28 is continuously conveyed. For the exposure, the radiation direction of the laser beam S is adjusted such that the center of the laser beam S is directed toward the center of the exposure roller 28. As shown in FIG. 13, the proximity gap Lg at the center of the laser beam S and that at the edge of the laser beam S are different because of curvature of the exposure roller 28. When the exposure roller radius is R, the laser beam radius is r, and the difference of the proximity gap between at the center and at the edge of the laser beam S is h, h is calculated by a following formula:

$$h = R - (R^2 - r^2)^{1/2}$$

When the long axis Lb of the laser beam S is 3 mm, h becomes 15 μm. When the long axis Lb of the laser beam S is 3.6 mm, h becomes 21.6 μm. The larger the roller diameter of the exposure roller 28 is, the smaller the difference of the proximity gap between at the center and at the edge of the laser beam S is. However, the larger the exposure roller 28 is, the larger the cost and space for it are. Accordingly, it is preferable that the diameter of the exposure roller 28 and the long axis Lb of the laser beam S are suitably adjusted.

In addition, the proximity gap Lg varies in a rotation period of the exposure roller 28, due to decentering of the exposure roller 28, lack of processing accuracy of the exposure roller 28, shake of the shaft and the like. In this embodiment, the deviation of the proximity gap Lg is designed to be approximately 20 μm. However, by accurate processing and assembling of the roller, the proximity gap Lg can be reduced to a few microns. The advantage of exposure on the exposure roller 28 is that flaps of the belt-like work 11 can be reduced. For example, when the belt-like work 11 is hanged between two rollers, a flapping width of a flat surface of the work between the rollers becomes handreds microns. The flap makes the deviation of the proximity gap Lg, which affects the exposed line width. An experiment proves that several tens of microns of the deviation in the proximity gap Lg hardly affects the exposure quality. In this embodiment, the proximity gap Lg is set to 50 μm to keep a margin for preventing a contact between the work and the mask caused by mechanical fluctuations, so that the work and the mask are not damaged.

Figure 14:
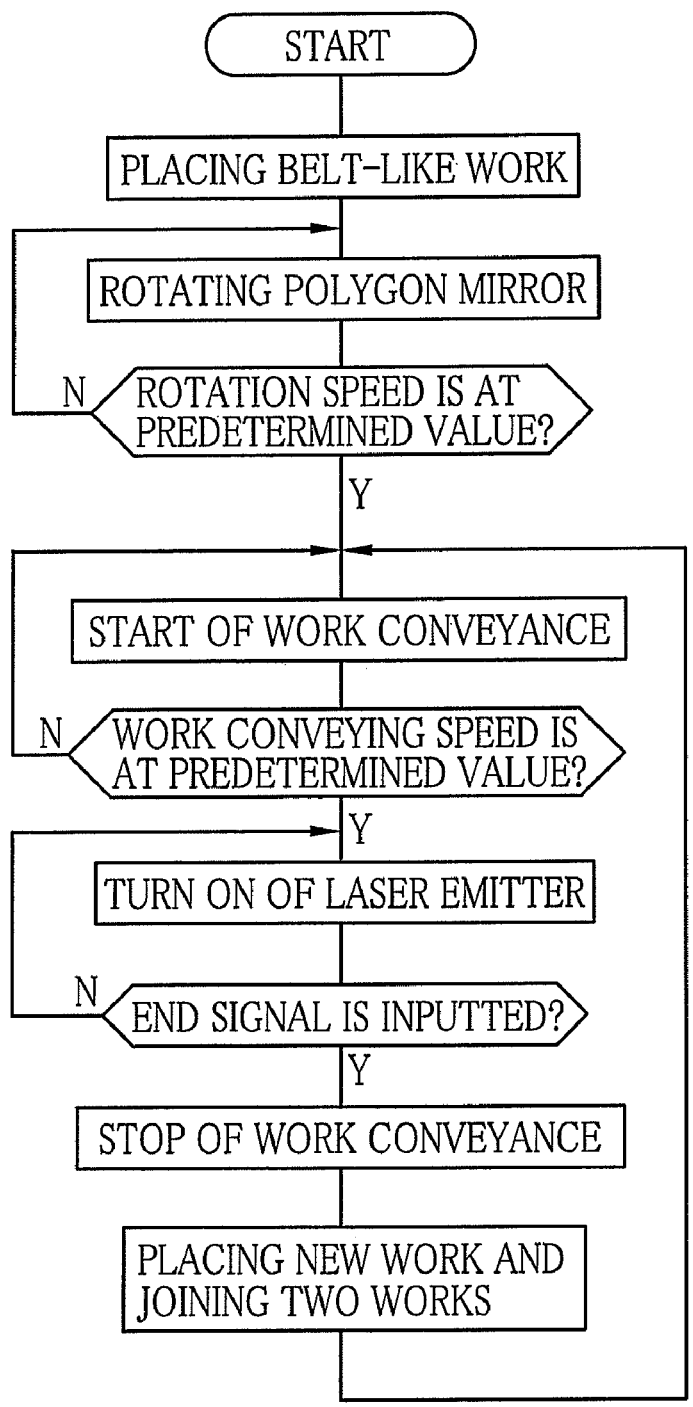
FIG. 14 is a flow chart showing exposure process for the electromagnetic shielding film.

Next, an outline of processes for the exposure of the electromagnetic shielding film 2 will be explained with reference to FIG. 14. The belt-like work 11 is the long film 20 having the thickness $t_1$=100 μm and the width $W_0$=650-750 mm on which the unexposed silver salt photosensitive material 21 is coated. 100 m to 1000 m of the belt-like work 11 is wound around the reel and the reel is set to the work feeding section 12. To the work winding section 14 the winding reel 24 is set and the leading end of the belt-like work 11 is connected to the winding reel 24. At this state, the illuminating section 30 starts the rotation of the polygon mirror 57 while the laser emitter 55 is in an off state, and then starts the conveyance of the belt-like work 11 after the polygon mirror 57 reaches the predetermined rotation speed.

As described above, to perform the multiple exposure without deviation, constant synchronization between the exposure period T and the work conveying speed V is needed. The easiest method to synchronize the exposure period T and the work conveying speed V is to synchronize the rotation speed ω and the work conveying speed V. The synchronization between the work conveying speed V and the exposure period T is performed such that a reference clock such as a quartz oscillator 90 (see FIG. 3) is provided, and the controller 16 controls the speed of each component with reference to the clock signal. Accordingly, the movement of the components is accurately synchronized. To generate a scan start signal of the polygon mirror 57, the laser beam to be scanned by the rotating mirror is detected as the scan start signal by an optical detector such as a photodiode, or a leading edge of pulse signal for mirror control, which is outputted one time per one surface, is detected as scan start signal.

The reason for starting the exposure after the establishment of the synchronization between the rotation speed ω and the work conveying speed V, is to easily distinguish between the correctly-exposed portion and the NG portion. Since the periodic pattern is exposed even if the exposure is performed while the rotation speed ω and the work conveying speed V are not synchronized, it is possible that the NG portion appears to be the correctly-exposed portion by visual inspection. In this case, a human error on the visual inspection may be caused to remain the NG portions in the product. In consideration of this problem, in this embodiment, the controller 16 monitors the synchronization so that the laser emitter 55 is controlled to emit light only when the synchronization is detected. Accordingly, since the periodic pattern is not exposed in the NG portion, the NG portion can be easily distinguished from the correctly-exposed portion by the visual inspection. At the beginning/ending of the operation, the laser emitter 55 is automatically controlled not to emit light because the rotation speed ω and the work conveying speed V are not synchronized.

When the rotation speed ω of the polygon mirror 57 and the work conveying speed V are synchronized, the controller 16 operates the laser emitter 55 to emit the laser beam S which exposes the periodic pattern 5 on the belt-like work 11 through the photomask 29. As above-described, this exposure is multiple exposure. The exposed belt-like work 11 is wound in the work winding section 14. When all of the belt-like work 11 in the work feeding section 12 is disappeared, an end signal is inputted to the controller 16 from the work feeding section 12 to stop the conveyance of the belt-like work 11. After that, the trailing end of the belt-like work 11 is cut and joined to the leading end of the belt-like work 11 newly set in the work feeding section 12 with a tape, at the work joining section 15.

After the joining, the work conveyance is restarted. When the joint portion passes on the exposure roller 28, the mask holding section 40 moves the photomask 29 to the retreat position. Accordingly, the photomask 29 and the joint portion are prevented from being damaged by contact. After the joint portion passes, the photomask 29 is returned to the exposing position with high accuracy, to set the predetermined proximity gap Lg. Note that it is preferable that the laser emitter 55 is in the off state while the joint portion passes below.

After the joint portion is wound in the work winding section 14, the conveyance is temporally stopped, and the end of the wound portion is held, cut, and taped. The roll of product is taken out, and then a new reel 24 is set and chacked. After that, the leading end of the remaining belt-like work 11 is connected to the reel 24. The above-described processes are the one cycle of the exposure and repeated for producing the products.

In the above embodiment, the feeding and winding are respectively performed in the single line. However, these may be performed in switchable two lines for reducing the switchover time of the works. In addition, a reserver or the like may be provided to completely eliminate the switchover time.

After the processes for the exposure, the exposed belt-like work 11 is subjected to a developing process. In the developing process, the meshed periodic pattern 5 of silver halide is developed. In a plating process, the periodic pattern 5 is subjected to electrolytic plating as the core of the plating, to be plated by copper. In this way, the production of the electromagnetic shielding film 2 is completed.

In this embodiment, the electromagnetic shielding film 2 of the silver salt photosensitive material is used. However, the exposure method and device of the present invention can be applied to a photosensitive member formed such that copper foil is glued on a PET substrate and a photoresist is coated on the copper foil, or a photosensitive material formed such that a DFR (dry film resist) is glued on the PET substrate. The wavelength of the light source needs to be adjested according to spectral sensitivity of the photosensitive member. After the development, the photosensitive material is subjected to an etching process to remove unnecessary portions of the copper foil. In this way, a mesh of copper is formed and the production of the electromagnetic shielding film is completed.

As the photosensitive material, a photoresist or a commercial dry film resist may be used instead of the silver salt photosensitive material. Although these types of the photosensitive material have lower sensitivity than the silver salt photosensitive material, these become applicable by increasing the light source power. Also in this case, the wavelength of the light source needs to be adjested according to spectral sensitivity of the photosensitive member.

Figure 15:
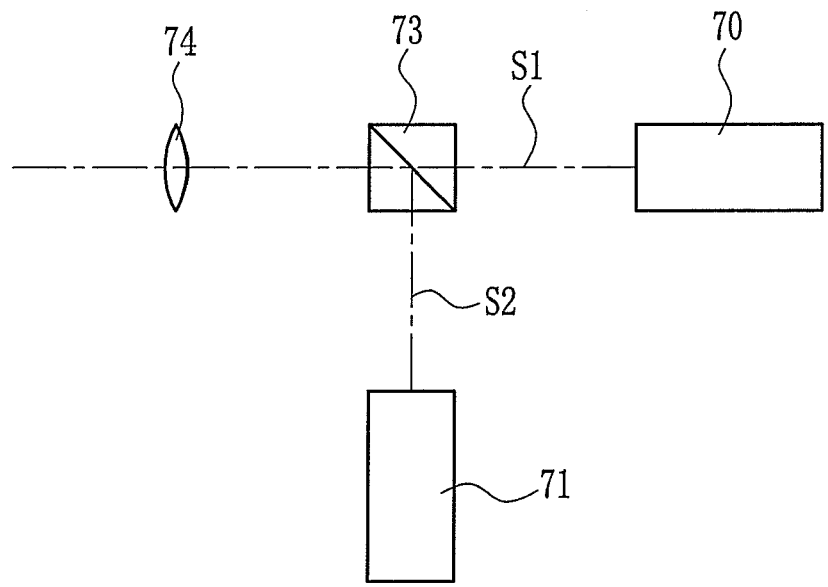
FIG. 15 is an explanatory view showing an exposure light source with two laser emitters which emit two channels of laser beams being subjected to polarization multiplexing.
Figure 16:
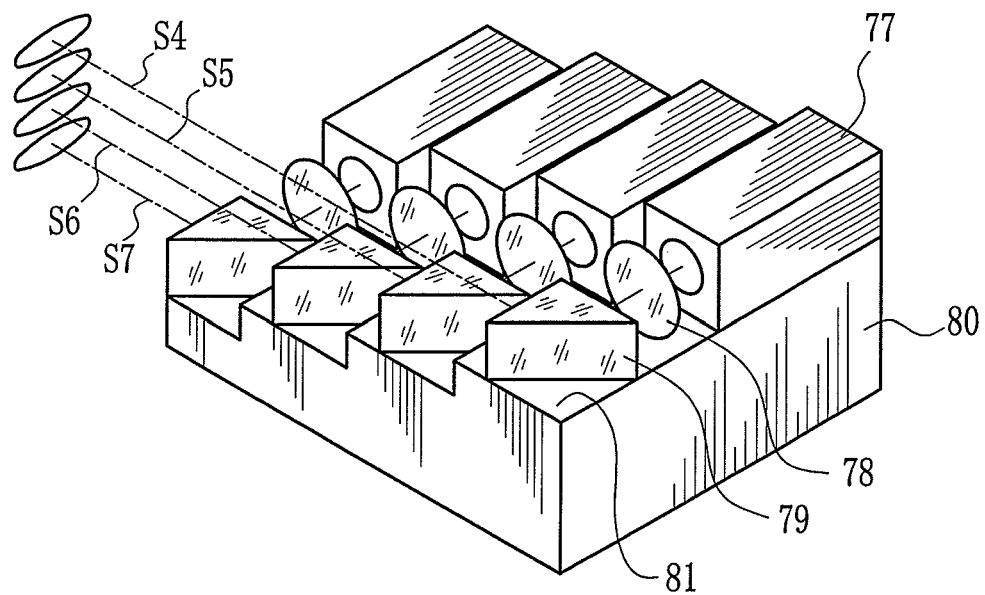
FIG. 16 is an explanatory view showing an exposure light source with plural laser emitters which emit plural laser beams for being composited.

In this embodiment, the single-mode semiconductor laser emitter with 60 mW output is used. However, the laser rated output is not limited to this. Rather, a high output light source is preferable in the sence that it can increase a desingn margin. To increase the light power, it may be possible that two laser beams S1 and S2 emitted from the two laser emitters 70 and 71 are subjected to polarization multiplexing in a prism 73 and the multiplexed light is collimated by a collimating lens 74, as shown in FIG. 15. Also, a multi-mode semiconductor laser emitter with 200 mW output may be used. In addition, as shown in FIG. 16, a set of a laser emitter 77, collimating lens 78 and a prism 79 may be provided on each step 81 of a tiered base 80, to composite laser beams S4 to S7 in a small area.

In the scan exposure, since the light is obliquely entered into the photomask 29, the scan angle becomes large at the both end porition of the belt-like work 11 in the width direction and the exposed periodic pattern 5 becomes distorted toward outside. To solve this problem, the mask patterns on the photomask 29 are previously shifted toward inside in the width direction. For example, when the incident angle is 20° and the proximity gap Lg is 50 μm, a distortion amount of the periodic pattern 5 exposed on the belt-like work 11 becomes 50·sin 20=17.1 μm. That is, the misalignment amount of the focus position becomes larger from the center of the photomask 29 in the width direction toward outside, and the maximum misalignment amount becomes 17.1 μm at the most outside portion. In case that the misalignment is not allowable, the position of rhombus of the mask pattern may be previously shifted 50 ·sin θ(μm) toward inside in the width direction to solve this problem.

When the scan angle becomes larger, the line width of the periodinc pattern 5 on the belt-like work 11 also becomes large. To prevent this problem, it is preferable that the line (slit) width of the mask pattern 33 becomes narrower toward both ends of the photomask 29. Accordingly, the line width of the exposed periodic pattern 5 is kept uniform along the width direction.

In case the pattern exposure is performed by the laser scan, it is preferable that the mask pattern 33 is inclined in amount of V·W/Vb which shows a moving length of the belt-like work 11 in one scan, when the work conveying speed is V, the width of the scan (=the pattern width) is W and the laser scan speed is Vb. The reason is that the exposed periodic pattern 5 is slant from the mask pattern 33 according to the conveyance length of the belt-like work 11. To correct the slant of the periodic pattern 5, the mask pattern 33 needs to be slanted toward the counter direction in amount of the slant of the periodic pattern 5. In this embodiment, since the width of the belt-like work 11 is 750 mm, V·W/Vb becomes (66.7 mm/sec÷123 m/sec)×750 mm=0.407 mm. Accordingly, when the mask pattern 33 is inclined 0.407 mm toward the downstream side of the laser scan in the work conveying direction from a position where the width direction of the mask pattern 33 is perpendicular to the work conveying direction, the width direction of the exposed periodic pattern 5 becomes parallel to the width direction of the belt-like work 11.

The combination of the polygon mirror and the collimated beam from the semiconductor laser is preferable in view of simplicity and low cost. However, there may be a case that the laser scan is not suitable for the exposure, for example when the periodic pattern is extremely large. In this case, a large-area collimated light source and a shutter device are preferably used for performing the exposure to a predetermined area in a predermined period. Note that high-presition of the uniformity of the brightness distribution of the light source is required in this system, because the brightness distribution directly affects the exposure amount on the belt-like work.

Figure 17:
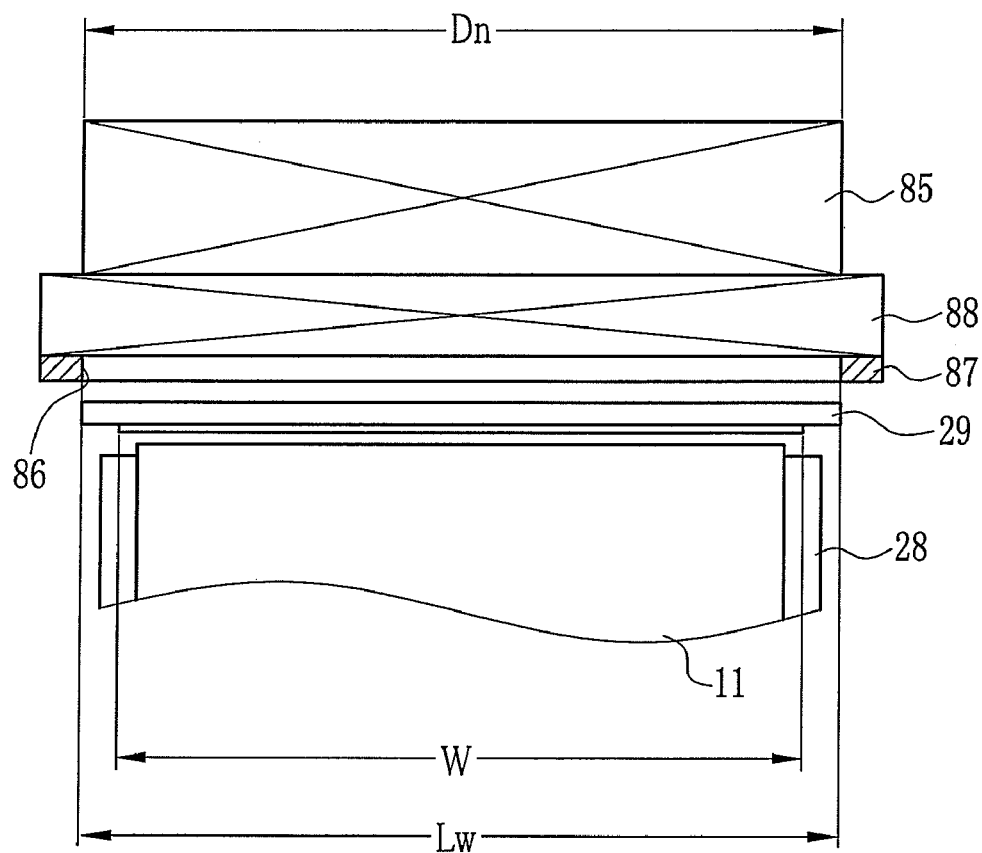
FIG. 17 is a front view of an exposure section with use of a surface emitting light source.

As shown in FIG. 17, as an exposure light source 85 of the exposure section, a simplified collimated light source having a large area whose diameter Dn is Ø800 mm is used. In this light source, light from a UV mercury lamp, a UV metal halide lamp or the like used in a so-called proximity exposure device, is collimated by a concave mirror and a collimating lens. In addition, it is preferable that a light shielding mask 87, which has a slit 86 with a length in the work conveying direction of 3.6 mm and a length in the width direction of Lw=800 mm, and a shutter device 88 is disposed between the exposure light source 85 and the photomask 29, to expose a thin long area in the width direction in an exposure time $T_{exp}$. As the shutter device 88, a mechanical shutter, a liquid crystal shutter or the like can be used. Since the length of the light projected on the photomask 29 along the width direction of the belt-like work 11 is Lw=800 mm, Lw>W can be satisfied when the pattern width of the photomask 29 is W=750 mm in the work width direction.

The above-described pattern exposure method and device are preferably utilized for the exposure of various periodic patterns, especially for an exposure of a seamless pattern on the belt-like work. An example of the seamless pattern is a mesh pattern for a magnetic shielding film for a plasma display. Since the adjacent periodic patterns are continually overwritten on former-written periodic patterns by the multiple exposure, seam defects such as a loss of the pattern by disturbances are hardly occurred.

The above-described pattern exposure method and device are further preferably used to expose the periodic pattern whose minimum line width Dmin is no more than 20 µm. In direct drawing by normal exposure beam, the diameter of the beam is approximately 50 µm, and the cost for equipment becomes considerably large for a mechanism to reduce the beam diameter. However, in the exposure method of the present invention, which uses the mask, high throughput can be realized because the line width can be easily made thinner and the continuous exposure can be performed.

Figure 18A:
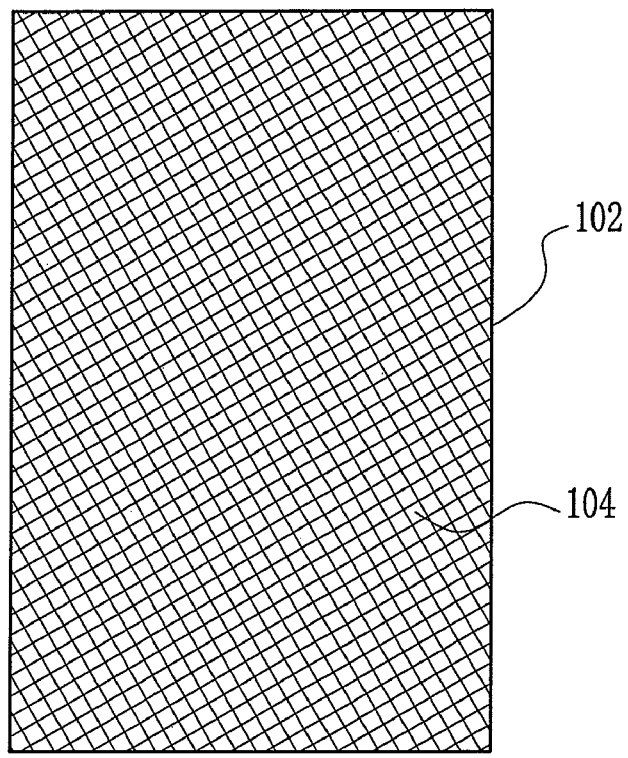
FIG. 18A is a plan view of an electromagnetic shielding film formed by a second embodiment of the present invention.
Figure 18B:
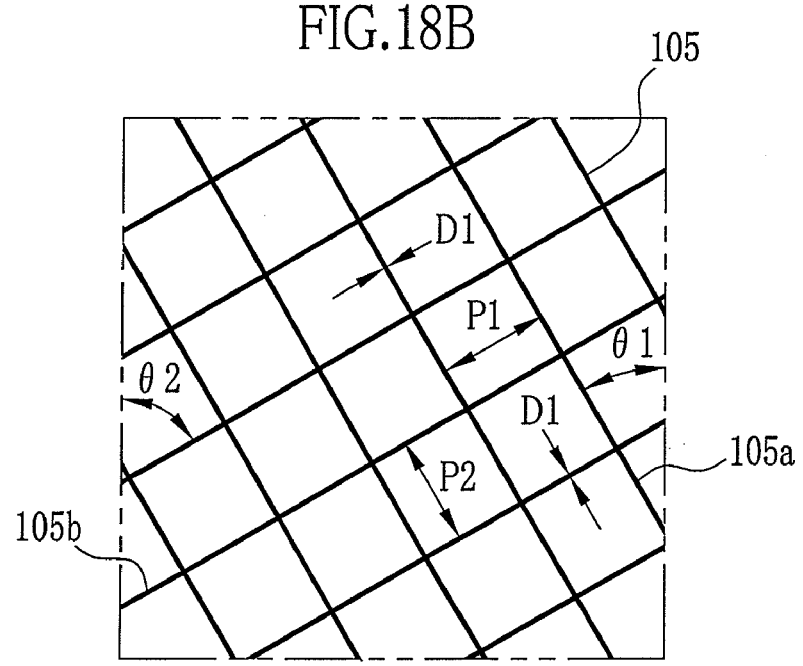
FIG. 18B is a partially enlarged view of FIG. 18A.

Next, a second embodiment of the present invention will be described. Note that the members same to the first embodiment are assigned numerals same to the first embodiment, and detailed explanations thereof are omitted. An electromagnetic shielding film 102 shown in FIG. 18A has an electromagnetic shielding pattern 104. As shown in FIG. 18B, a periodic pattern 105 is constituted of thin lines 105*a* whose width D1 is 10 µm to 20 µm, spacing pitch P1 is 300 µm and alignment angle θ1 is 30°, and thin lines 105*b* whose width D2 is same to the width D1, spacing pitch P2 is same to the pitch P1 and alignment angle θ2 is 60°.

Figure 19:
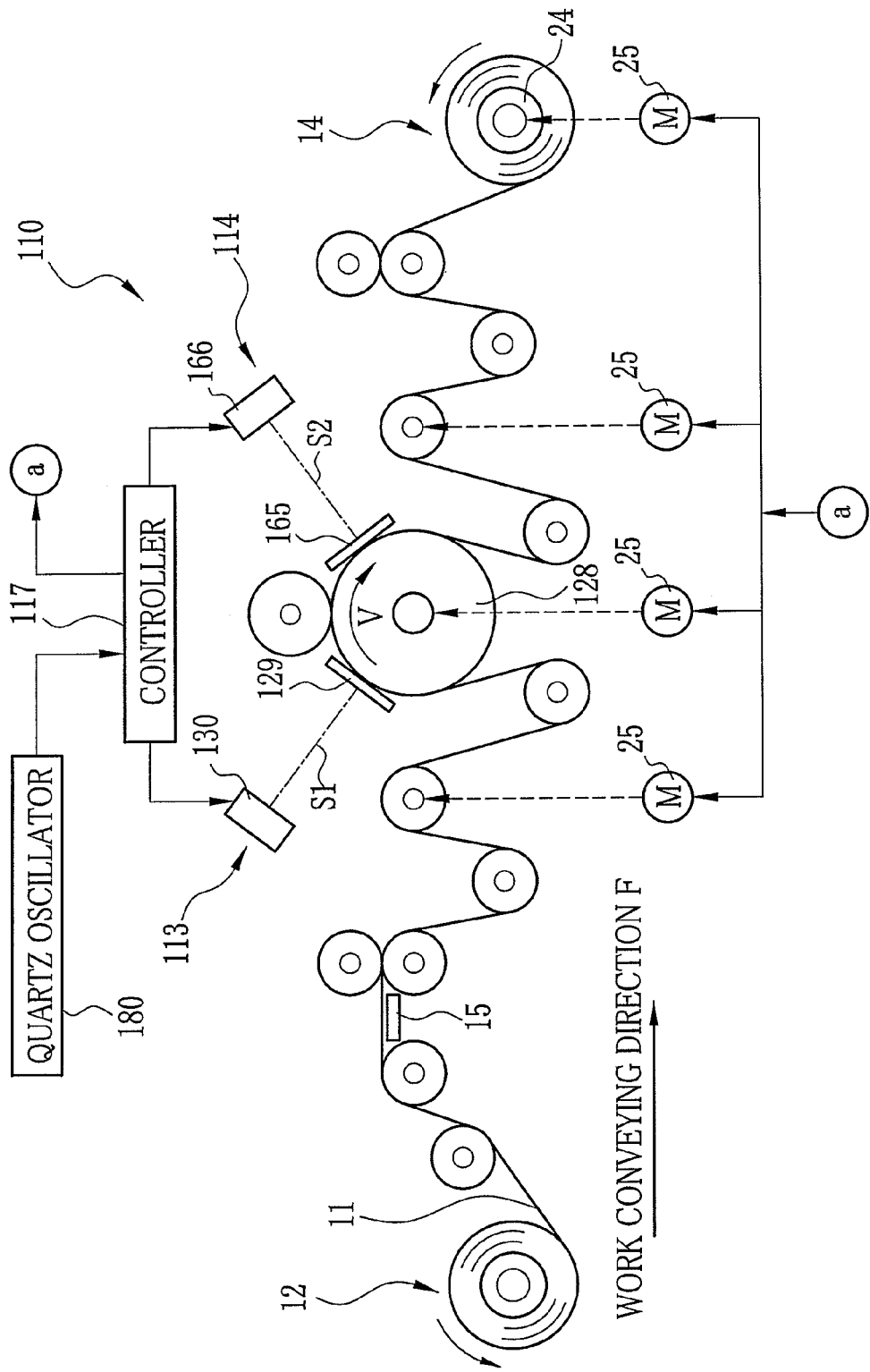
FIG. 19 is a schematic view showing a construction of a pattern exposure apparatus of the second embodiment of the present invention.

As shown in FIG. 19, a pattern exposure apparatus 110 for forming the periodic pattern 105 comprises a first exposure section 113 for proximity exposure of the silver salt photosensitive material on the belt-like work 11 in a shape of the thin lines 105*a*, a second exposure section 114 for proximity exposure of a shape of the thin lines 105*b* over the exposed thin lines 105*a* on the belt-like work to form the periodic pattern 105, and a controller 117 for totally controlling each section of the pattern exposure apparatus 110.

The first exposure section 113 is composed of a first photomask 129 disposed above an exposure roller 128, and a first illuminating section 130 for illuminating the first photomask 129. As shown in FIG. 20A and FIG. 20B, the first photomask 129 is composed of for example a mask substrate 132 formed of a transparent soda glass having a thickness $t_2$ of 4.5 mm, a mask length (in the work conveying direction F) Lm of 200 mm and a mask width Wm of 800 mm, and a first mask pattern 133, formed in a pattern area 135 having a pattern length (in the work conveying direction F) L of 200 mm and a pattern width (in the work width direction) W of 760 mm, on one surface of the mask substrate 132.

The first mask pattern 133 is formed of for example slits on a light shielding pattern of black. The slits shape the first mask pattern 133 and allow transmission of light. Note that although the shielding pattern is black and the first mask pattern 133 (slits) is white actually, the shielding pattern is drawn in white and the mask pattern is drawn in black in FIG. 20A, in consideration of viewability of the figure.

Figure 21A:
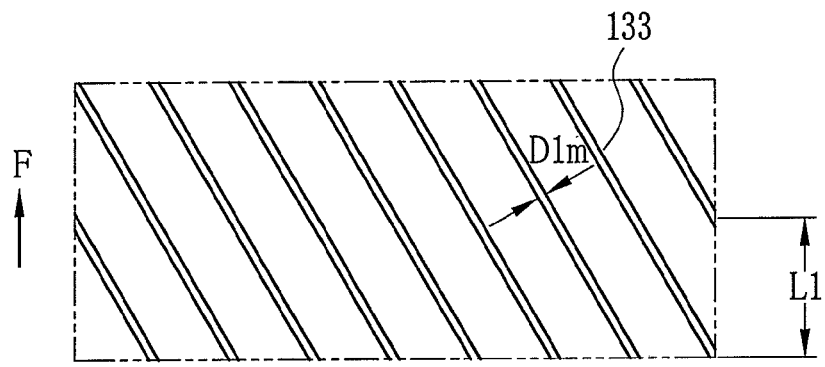
FIG. 21A is an explanatory view showing a shape of a first mask pattern.

As shown in FIG. 21A, the first mask pattern 133 is for exposing the thin lines 105*a* of the periodic pattern 105 described above, and is formed on the mask substrate 132 by chrome deposition. A period (period length L1) for repetition of the exposure of the first mask pattern 133 in the work conveying direction F is L1=P1/sin θ1=300/sin 30°=300 µm. Note that the line width D1*m* of the first mask pattern 133 is preferably nallower than the desired line width D1 of the periodic pattern 105, in consideration of line broadening effect by proximity exposure.

As same as the first exposure section 113, the second exposure section 114 is comprised of a second photomask 165 disposed above the exposure roller 128, and a second illuminating section 166 for illuminating the second photomask 165. As same as the first photomask 129, the second photomask 165 is composed of a mask substrate and a plurality of second mask patterns formed in the mask substrate. The mask substrate and the size of the pattern area are same in the first photomask 129 and the second photomask 165.

Figure 21B:
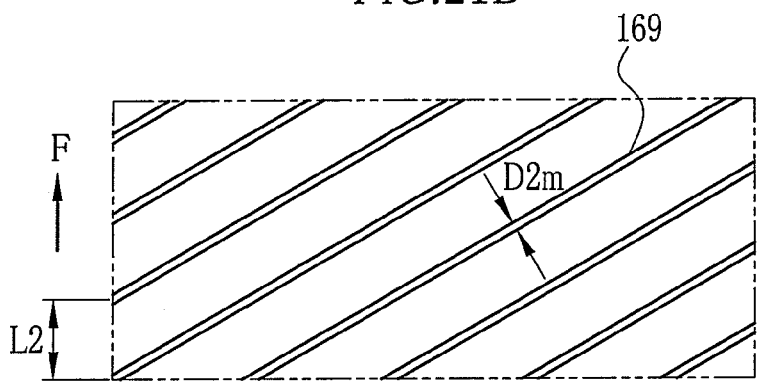
FIG. 21B is an explanatory view showing a shape of a second mask pattern.

As shown in FIG. 21B, the second mask pattern 169 is for exposing the thin lines 105*b* of the periodic pattern 105 described above, and is formed on the mask substrate by chrome deposition. A period length L2 of the second mask pattern 169 in the work conveying direction F is L2=P2/sin θ2=300/sin 60°=346 µm. Note that the line width D2 m of the second mask pattern 169 is preferably nallower than the desired line width D2 of the periodic pattern 105, in consideration of line broadening effect by proximity exposure.

Figure 21C:
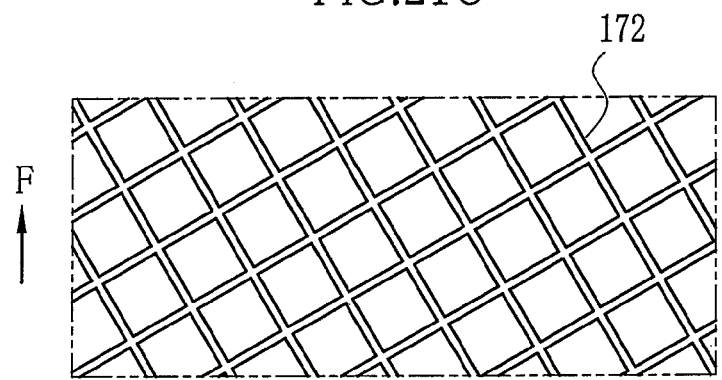
FIG. 21C is an explanatory view showing a shape of a combination of the first mask pattern and the second mask pattern.

When the first mask pattern 133 and the second mask pattern 169 are overlapped, a pattern 172 same to the periodic pattern 105 appears as shown in FIG. 21C. Accordingly, to form the periodic pattern 105, the exposure in the first exposure section 113 and the exposure in the second exposure section 114 are sequentially performed. Note that other components of the second exposure section 114 are same to that of the first exposure section 113 and detailed explanations of them are omitted.

Next, a method for exposing the meshed periodic pattern 105 with use of the above-described pattern exposure apparatus 110 will be described.

The exposure area covering at least one period of the first mask pattern 133 is a minimum required area including a region of 600 μm (the period length L1) in the conveying direction and 750 mm in the width direction which is needed to expose the one period of the first mask pattern 133.

When the period length L1 of the first mask pattern 133 is 600 μm in the conveyance direction, the work conveying speed of the belt-like work 11 is V=4 m/min, the exposure period for exposing the first mask pattern 133 is T1, the exposure time is $T1_{exp}$, and the minimum line width D1 mmin of the first mask pattern 133 is 10 μm, the required time for conveying the period length L1 of the belt-like work 11 becomes L1/V=9.0 msec. When one scan is designed to perform in this time period, the exposure period T1 becomes 9.0 msec and the rotation speed of the polygon mirror 57 with eighteen reflecting surfaces becomes ω1=370 rpm. In this case, the scan speed Vb1 becomes Ls·ω1=86.9 m/sec because the distance Ls between the polygon mirror 57 and the first photomask 129 is 2250 mm. Since the width Wb of the projection shape of the laser beam S1 is 1.2 mm, the exposure time $T1_{exp}$ of the laser beam S1 at this scan speed Vb1 becomes 1.2/Vb1=13.9 μsec, and the conveyance length Lc1 of the belt-like work 11 in this exposure time $T1_{exp}$ becomes V·$T1_{exp}$=0.93 μm.

The conveyance length Lc1 is a misalignment amount of the belt-like work 11 toward the first photomask 129 in the conveyance direction F during the exposure. Accordingly, if the conveyance length Lc1 is larger than the minimum line width D1 mmin of the first mask pattern 133, the line width D1 of the thin line 105a becomes larger to decrease the exposure quality. To assure the good exposure quality, the relation V·$T1_{exp}$<D1 mmin is required. In this embodiment, since the relation V·$T1_{exp}$=0.93 μm<D1 mmin=10 μm is satisfied, the good exposure quality can be maintained.

In this embodiment, the projection shape of the laser beam S1 has the long axis Lb of 3.6 mm and the short axis Wb of 1.2 mm, and a light shielding mask, which includes a slit having a width Ws approximately equal to the long axis Lb of the laser beam S1, is provided on the back side of the first photomask 129, to prevent that the first photomask 129 is exposed in a width larger than the width Ws. Accordingly, the exposure area for one scan of the laser beam S1 has a size of 3.6 mm (in the conveying direction)×750 mm. (in the width direction), which means that 3.6/0.6=6 pieces of the first mask patterns 133 are exposed at the one scan, and each piece of the first mask pattern 133 is subjected to multiple exposure.

The length of the light projected on the first photomask 129 from the exposure light source (Lb) is 3.6 mm as described above, which satisfies Lb=3.6>L1=0.6. A quotient m1 of Lb/L1 becomes 6. Accordingly, when the relation between the work conveying speed V and the exposure period T1 satisfies (n1−1)×(L1/V)=T1 (n1 is a natural number) and 2≦n1≦m1=6, any number can be selected from 2 to 6 as n1. When n1=2, the number of times of the multiple exposure is maximized. In this embodiment, as described above, since the required time for conveying the period length L1 of the belt-like work 11 is L1/V=9.0 msec, and the one scan is performed in this time period, the relation between T1 and V is determined to satisfy T1=9.0 msec and n1=2.

The exposure area covering at least one period of the second mask pattern 169 is a minimum required area including a region of 346 μm (the period length L2) in the conveying direction and 750 mm in the width direction which is needed to expose the one period of the second mask pattern 169.

When the period length L2 of the second mask pattern 169 is 346 μm in the conveyance direction, the work conveying speed of the belt-like work 11 is V=4 m/min, the exposure period for exposing the second mask pattern 169 is T2, the exposure time is $T2_{exp}$, and the minimum line width D2 mmin of the second mask pattern 169 is 10 μm, the required time for conveying the period length L2 of the belt-like work 11 becomes L2/V=5.2 msec. When two scans are designed to perform in this time such that the total number of scans become closer between the first and second exposure sections 113 and 114, the exposure period T2 becomes 10.4 msec and the rotation speed of the polygon mirror with eighteen reflecting surfaces becomes ω2=320 rpm. In this case, the scan speed Vb2 becomes Ls·ω2=75.2 m/sec because the distance Ls between the polygon mirror and the second photomask 165 is 2250 mm. Since the width Wb of the projection shape of the laser beam S2 is 1.2 mm, the exposure time $T2_{exp}$ of the laser beam S2 at this scan speed Vb2 becomes 1.2/Vb2=13.4 μsec, and the conveyance length Lc2 of the belt-like work 11 in this exposure time $T2_{exp}$ becomes V·$T2_{exp}$=1.07 μm. In this embodiment, since the relation V·$T2_{exp}$=1.07 μm<D2 mmin=10 μm is satisfied, the good exposure quality can be maintained.

On the back side of the second photomask 165, a light shielding mask, which includes a slit having a width Ws approximately equal to the long axis Lb of the laser beam S2, is provided to prevent that the second photomask 165 is exposed in a width larger than the width Ws. Accordingly, the exposure area for one scan of the laser beam S2 has a size of 3.6 mm (in the conveying direction)×750 mm (in the width direction), which means that 3.6/0.364=10.4 pieces of the second mask patterns 169 are exposed at the one scan, and each piece of the second mask pattern 169 is subjected to multiple exposure.

The length of the light projected on the second photomask 165 from the exposure light source (Lb) is 3.6 mm as described above, which satisfies Lb=3.6>L2=0.346. A quotient m2 of Lb/L2 becomes 10. Accordingly, when the relation between the work conveying speed V and the exposure period T2 satisfies (n2−1)×(L2/V)=T2 (n2 is a natural number) and 2≦n2≦m2=10, any number can be selected from 2 to 10 as n2. When n2=2, the number of times of the multiple exposure is maximized. In the second exposure section 114, the relation between T2 and V is determined to satisfy n2=3 and 2×L2/V=10.4 msec, such that the total number of scans in the second exposure section 114 become closer to that in the first exposure section 113 determined by the exposure period T1, that is, one scan is performed while conveying two periods of the second mask patterns 169 to synchronize to phase of the exposure period T1 of the first exposure section 113. Accordingly, one scan is performed while conveying 346 μm×2=692 μm.

Figure 22A:
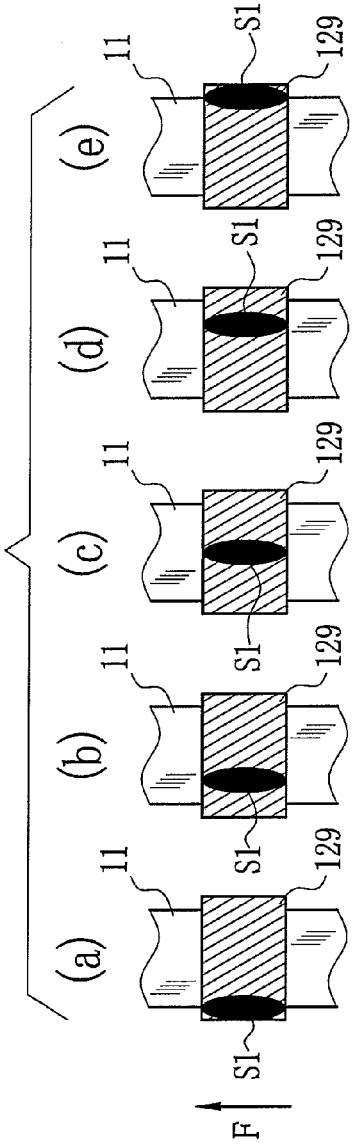
FIG. 22A is an explanatory view showing scan process of the laser beam on the first photomask.
Figure 22B:
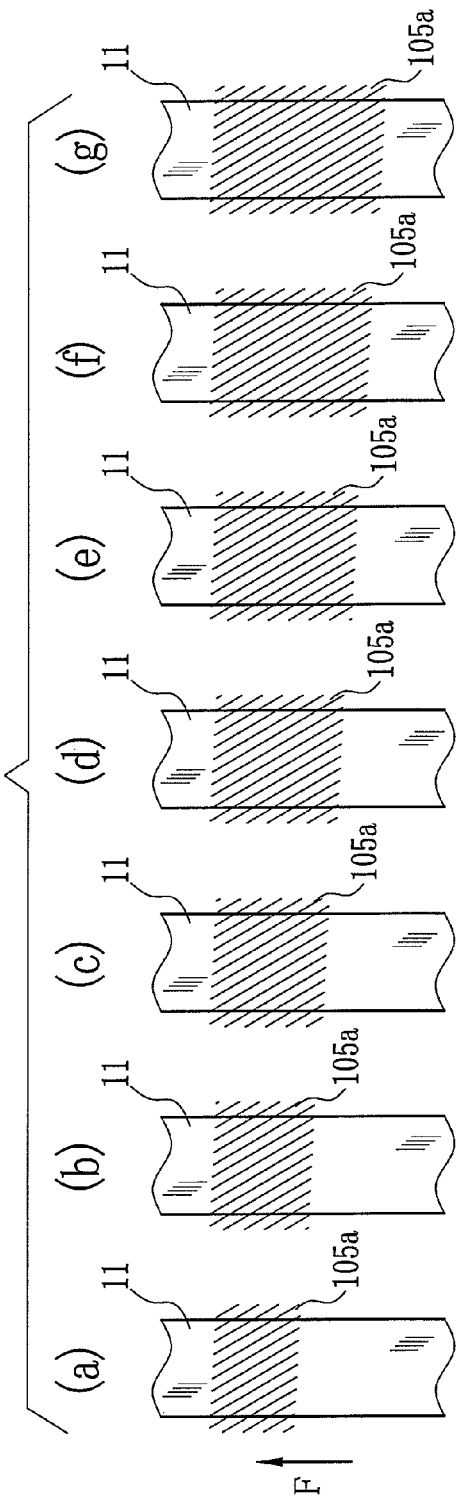
FIG. 22B is an explanatory view showing the pattern exposed on the work by a first exposure section.

As shown in (a) to (e) of FIG. 22A, in the first exposure section 113, the one scan of the laser beam S1 exposes 6 rows of the first mask patterns 133 from left to right through the first photomask 129. As a result, as shown in (a) of FIG. 22B, on the belt-like work 11, 6 rows of the thin lines 105a are exposed along the work conveying direction F. Since the belt-like work 11 is conveyed to the period length L1 in the work conveying direction F while the one scan, the same pattern is over-exposed on the portion of the belt-like work 11 where the thin lines 105a have already been exposed through the first photomask 129 when this portion passes below the first photomask 129. At this time, the thin line 105a can be over-exposed exactly on the former-exposed thin line 105a if the work conveying speed V and the exposure period T1 are synchronized. By repeating this sequence, as shown in (a) to (g) of FIG. 22B, each thin line 105a is exposed 6 times on the belt-like work 11. Note that at the start and end of the operation of the pattern exposure apparatus 110, there became portions of the belt-like work 11 where the number of times of the exposure is gradually decreased. These portions are withdrawn as NG portions.

As shown in (a) to (e) of FIG. 23A, in the second exposure section 114, the one scan of the laser beam S2 exposes 10.4 rows of the second mask patterns 169 from left to right through the second photomask 165. As a result, as shown in (a) of FIG. 23B, on the belt-like work 11 where the thin lines 105a have already been exposed by the first exposure section 113, 10.4 rows of the thin lines 105b are exposed along the work conveying direction F. Since the belt-like work 11 is conveyed to twice the period length L2 (L2×2) in the work conveying direction F while the one scan, the same pattern is over-exposed on the portion of the belt-like work 11 where the thin lines 105b have already been exposed through the second photomask 165 when this portion passes below the second photomask 165. At this time, the thin line 105b can be over-exposed exactly on the former-exposed thin line 105b if the work conveying speed V and the exposure period T2 are synchronized. By repeating this sequence, as shown in (a) to (g) of FIG. 23B, each thin line 105b is exposed 5.2 times on the belt-like work 11. Accordingly, the periodic pattern 105 is formed by the overlap of the thin lines 105a and 105b.

Since the thin lines 105a and 105b are continually exposed in the two exposure sections 113 and 114 in a seamless manner, continuous mesh pattern which is an arrangement of 15° inclined rhombuses each having a side of 300 μm and a diagonal length of 424 μm can be made. However, there is a problem that the total exposure amount at the cross point of the thin lines 105a and 105b becomes twice as large as that at other portions. To maintain the shape of the exposed pattern regardless of oversaturation, for example a photosensitive material, having a property in which an increase of the exposure amount does not affect the line width after the density is saturated, is used.

In contrary, the above problem turns to be an advantage for making the mesh pattern of the electromagnetic shielding material. A surface resistance value is preferably lowered as much as possible because the surface resistance determines the shielding performance of the final product and plating process suitability of a partly-finished product after the development. To lower the resistance value of the mesh, the resistance value at the cross point of the mesh performs essential role. Concretely, when two lines having a same resistance value is crossed, it is preferable that doubled electric current flows through the cross point of them. However, to apply the doubled electric current, the cross point needs to have a width twice as broad as that of each line when the resistivity of the cross point is same as that of each line. That is, the resistivity of the cross point needs to be half as much as that of each line when the width is same between the cross point and each line. Accordingly, in the normal mesh, the high resistivity of the cross point interferes to reduce the resistance value of the mesh. On the other hand, in the above embodiment, since the 2 times of exposures are overlapped at the cross point of the mesh, the density of the silver (amount of the silver) at the cross point is increased, which reduces the resistivity of the cross point. Therefore, the mesh having lower resistance value can be made without broading the width of the cross point.

As same as to make the continuous mesh pattern described above, which is an arrangement of 15° inclined rhombuses each having a side of 300 μm and a diagonal length of 424 μm, the above-described method is preferably applied to make a mesh pattern which is an arrangement of rhombuses without inclination each having a side of 300 μm and a diagonal length of 424 μm. Although this pattern can be made by a single exposure section having a mesh pattern as the mask pattern, the combination of the two kinds of thin lines exposed in the two exposure sections can make the cross point whose resistance value is lower than that of the cross point made by the single exposure section.

As same as the first embodiment, the above-described pattern exposure method and device of the second embodiment are preferably utilized for the exposure of various periodic patterns, especially for an exposure of a seamless pattern on the belt-like work. An example of the seamless pattern is a mesh pattern for a magnetic shielding film for a plasma display. Since the adjacent periodic patterns are continually overwritten on former-written periodic patterns by the multiple exposure, seam defects such as a loss of the pattern by disturbances are hardly occurred. In addition, since a special system for adjusting the exposure timings between the first and second exposure sections 113 and 114 is not required to obtain the same patterns regardless of a position for starting the exposure, only simple operations is required for the exposure.

In the above embodiment, the same patterns are seamlessly exposed. However, the present invention can perform also an exposure of different patterns between the seamless patterns. Hereinafter, an example of the exposure of different patterns between the seamless patterns is described. Note that detailed explanations about the parts same as in the above embodiment are omitted.

Figure 24A:
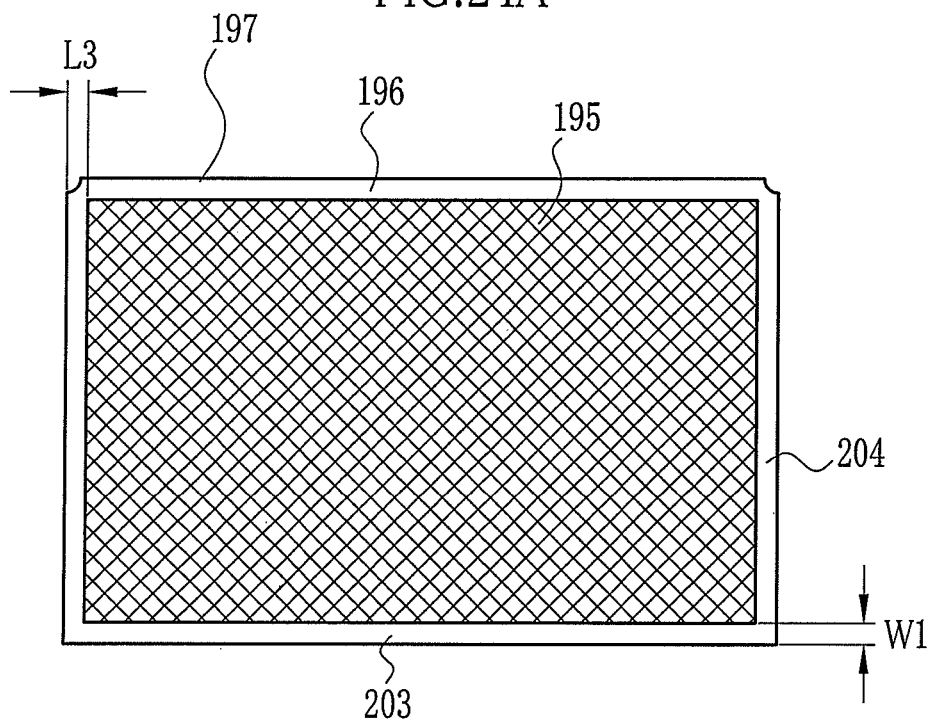
FIG. 24A is a plan view of an electromagnetic shielding film having a rim around entire circumference.

As shown in FIG. 24A, an electromagnetic shielding film 197 has a rim 196 for earthing around an outer peripheral portion of a meshed electromagnetic shielding pattern 195. As shown in FIG. 25, the electromagnetic shielding film 197 is continuously formed on a long belt-like work 198.

Figure 24B:
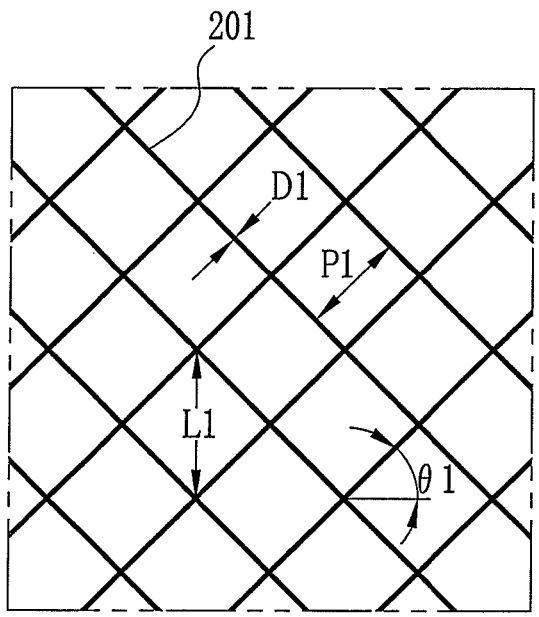
FIG. 24B is a partially enlarged view of FIG. 24A.

The electromagnetic shielding pattern 195 is composed of a periodic pattern 201 on the transparent film formed by silver, and copper plating applied on the surface of the periodic pattern 201. As shown in FIG. 24B in partially-enlarged manner, the periodic pattern 201 is arranged such that thin lines having a width D1 of 10 μm to 20 μm are at right angles to each other, with spacing pitch P1 of 300 μm and alignment angle θ1 of 45°.

The rim 196 is composed of lateral edge sections 203 along a conveying direction of the belt-like work 198 (work conveying direction F) by a pattern exposure apparatus, and orthogonal sections 204 perpecdicular to the work conveying directnion F. For example, the lateral edge section 203 has a width W1 of 50 mm, and the orthogonal section 204 has a length L3 of 45 mm in the work conveying direction F. The orthogonal section 204 is firstly formed in a width L4 of 90 mm in the work conveying direction F on the belt-like work 198, and then cut in the middle into the width of 45 mm. The orthogonal sections 204 are formed at a regular pitch Pf of for example 1090 mm in the work conveying direction F.

Figure 26:
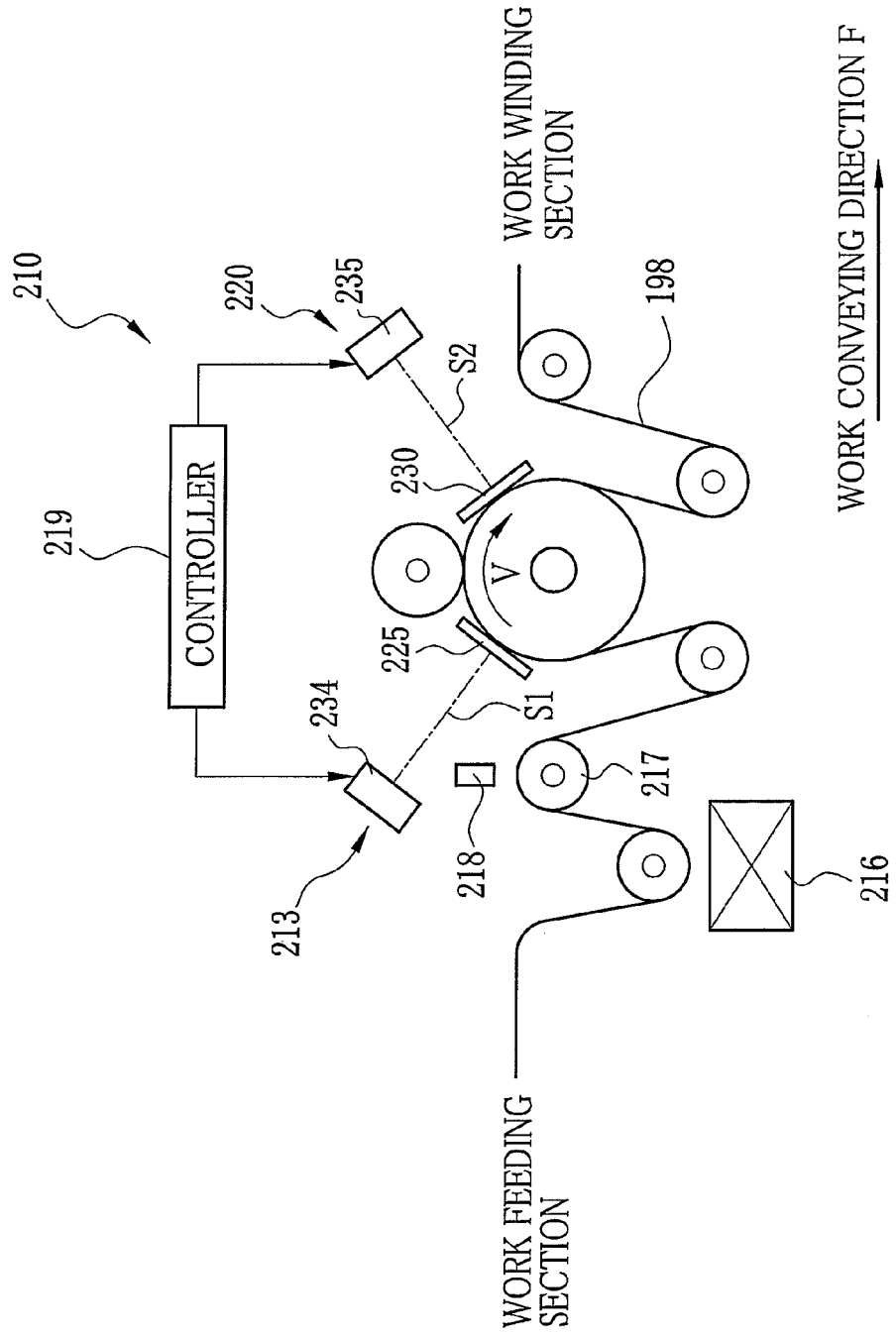
FIG. 26 is a schematic view showing a construction of a pattern exposure apparatus for exposure of the electromagnetic shielding film having the rim.

A pattern exposure apparatus 210 for performing an exposure on the electromagnetic shielding film 197 is shown in FIG. 26. Since the pattern exposure apparatus 210 is similar to the exposure device 110 shown in FIG. 19, only differences between them will be described.

The pattern exposure apparatus 210 includes a first exposure section 213 to expose the periodic pattern 201 and the lateral edge section 203 of the rim 196, and a second exposure section 220 to expose the orthogonal section 204 of the rim 196. In an upstream side from the first exposure section 213, there is a notching device which measures a conveyance length of the belt-like work 198 and forms notches 215 (see FIG. 25) on one lateral edge of the belt-like work 198 at certain intervals. The notching device 216 includes for example an oscillating die set and so on, to form the notches 215 by punching the lateral edge of the belt-like work 198. There is a notch detection sensor 218 above a pass roller 217 positioned near the first exposure section 213, to detect the existence of the notches 215. The notch detection sensor 218 is a transmissive type sensor, and detection signal is inputted into a controller 219 to determine a timing of start of an exposure in the second exposure section 220.

A shape of the notch 215 is not limited in the present invention. In addition, markings by a laser marker, holes by a piercing device or the like may be used instead of the notch 215. Further, it may be that magnetic recording sections are formed on the lateral edge of the belt-like work 195 to store information.

Figure 27A:
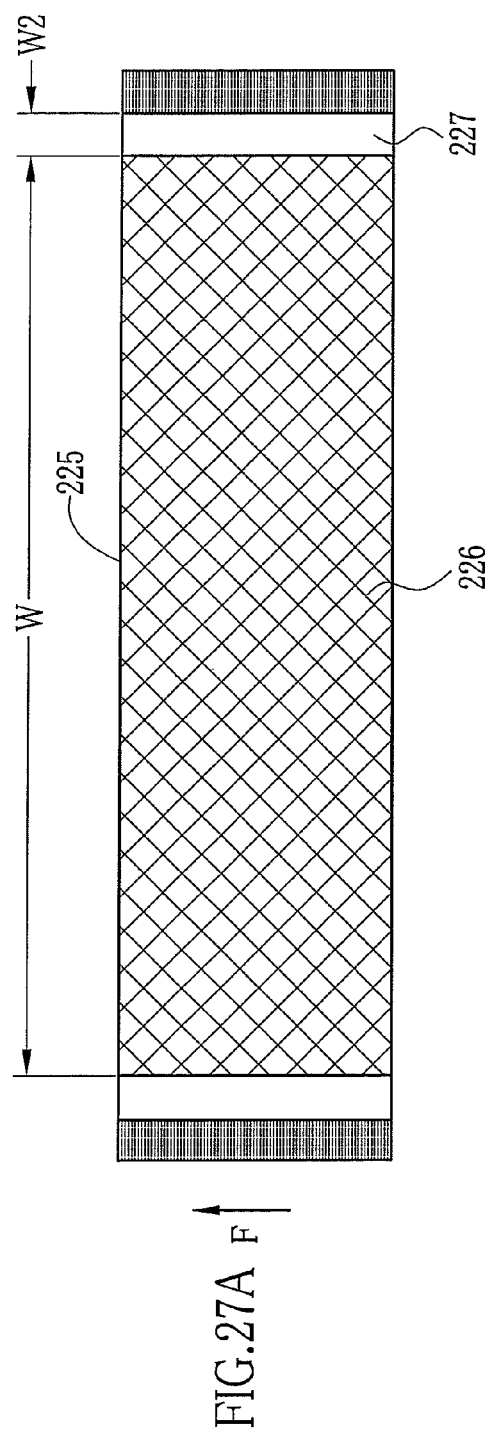
FIG. 27A is a plan view of a first photomask for exposure of the electromagnetic shielding film having the rim.

As shown in FIG. 27A, the first photomask 225 set in the first exposure section 213 has a mesh pattern 226 for making the periodic pattern 198, and first solid patterns 227 for making the lateral edge section 203 of the rim 196. The mesh pattern 226 is formed of for example slits on a light shielding pattern of black. The slits shape the mesh pattern 226 and allow transmission of light. Note that although the shielding pattern is black and the mesh pattern 226 (slits) is white actually, the shielding pattern is drawn in white and the mesh pattern is drawn in black in FIG. 27A, in consideration of viewability of the figure.

Figure 27B:
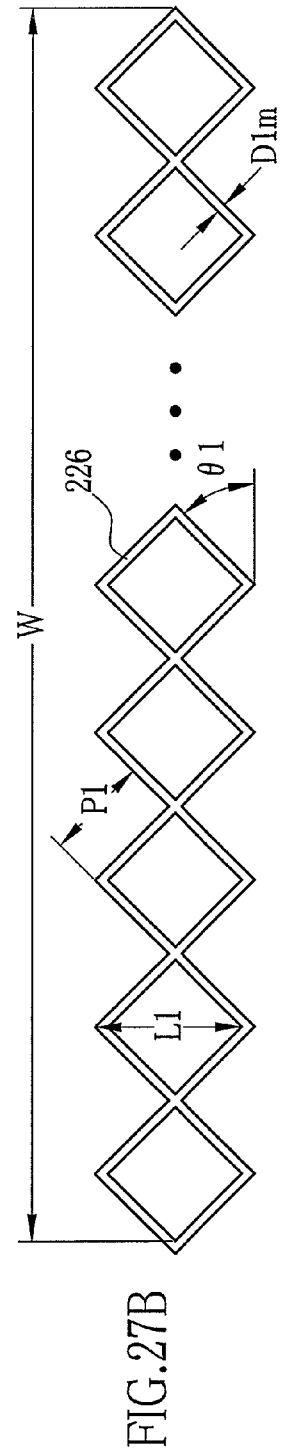
FIG. 27B is a partially enlarged explanatory view of a mesh pattern on the first photomask.

As shown in FIG. 27B, the mesh pattern 226 is an arrangement of squares each having a 300 μm side inclined at θ1=45°aligned along the width direction, and are formed on the mask substrate by chrome deposition. A period (period length L1) for repetition of the exposure of the mesh pattern 226 in the work conveying direction F is L1=P1/sin θ1=300/sin 45°=424 μm. The mesh pattern 226 has a working width W of 760 mm, and the first solid pattern 227 has a working width W2 of 50 mm according to the width of the lateral edge section. Note that the line width D1$m$ of the mesh pattern 226 is preferably nallower than the desired line width D1, in consideration of line broadening effect by proximity exposure.

As shown in FIG. 28, the second photomask 230 in the second exposure section 220 has a second solid pattern 231 in center portion thereof along the width direction, for the exposure of the orthogonal section 204. The second solid pattern 231 has a length L5 of 90 mm in the work conveying direction, and a width W3 of 760 mm in the width direction. Note that although the shielding pattern is black and the second solid pattern 231 is white actually, the shielding pattern is drawn in white in FIG. 28, in consideration of viewability of the figure.

Operation of the pattern exposure apparatus will be described below. When the conveyance of the belt-like work 198 starts, the notching device 216 measures the length of the belt-like work 198 and forms the notches 215 on the lateral edge of the belt-like work 198 at predetermined intervals of for example 1090 mm. When a rotation speed of a polygon mirror of each of illuminating sections 234 and 235 and the work conveying speed V are synchronized, the first exposure section 213 scans laser beam on the first photomask 225, to expose the meshed periodinc patterns 201 and the lateral edge sections 203 of the rim 196 on the belt-like work 198.

When the period length L1 of the mesh pattern 226 is 424 μm in the conveyance direction, the work conveying speed of the belt-like work 198 is V=4 m/min, the exposure period for exposing the mesh pattern 226 is T1, the exposure time is $T1_{exp}$, and the minimum line width D1 mmin of the mesh pattern 226 is 10 μm, the required time for conveying the period length L1 of the belt-like work 198 becomes L1/V=6.36 msec. When one scan is designed to perform in this time period, the exposure period T1 becomes 6.36 msec and the rotation speed of the polygon mirror with eighteen reflecting surfaces become ω1=524 rpm. In this case, the scan speed Vb1 becomes Ls·ω1=123 m/sec because the distance Ls between the polygon mirror and the first photomask 225 is 2250 mm. Since the width Wb of the projection shape of the laser beam S1 is 1.2 mm, the exposure time $T1_{exp}$ of the laser beam S1 at this scan speed Vb1 becomes 1.2/Vb1=9.8 μsec, and the conveyance length Lc1 of the belt-like work 198 in this exposure time $T1_{exp}$ becomes V·$T1_{exp}$=0.65 μm. In this embodiment, since the relation V·$T1_{exp}$=0.65 μm<D1 mmin=10 μm is satisfied, the good exposure quality can be maintained.

In this embodiment, the projection shape of the laser beam S1 has the long axis Lb of 3.6 mm and the short axis Wb of 1.2 mm, and a light shielding mask, which includes a slit having a width approximately equal to the long axis Lb of the laser beam S1, is provided on the back side of the first photomask 225, to prevent that the first photomask 225 is exposed in a width larger than the width of the slit. Accordingly, the exposure area for one scan of the laser beam S1 has a size of 3.6 mm (in the conveying direction)×750 mm (in the width direction), which means that 3.6/0.424=8.5 pieces of the mesh patterns 226 are exposed at the one scan, and each piece of the mesh pattern 226 is subjected to multiple exposure.

The length of the light projected on the first photomask 225 from the exposure light source (Lb) is 3.6 mm as described above, which satisfies Lb=3.6>L1=0.424. A quotient m1 of Lb/L1 becomes 8. Accordingly, when the relation between the work conveying speed V and the exposure period T1 satisfies (n1−1)×(L1/V)=T1 (n1 is a natural number) and 2≦n1≦m1=8, any number can be selected from 2 to 8 as n1. When n1=2, the number of times of the multiple exposure is maximized. In this embodiment, as described above, since the required time for conveying the period length L1 of the belt-like work 198 is L1/V=6.36 msec, and the one scan is performed in this time, the relation between T1 and V is determined to satisfy T1=6.36 msec and n1=2.

In the second exposure section 220, the solid pattern having 90 mm length is exposed. The exposure time $T2_{exp}$ is 90/66.7=1.35 sec at the work conveying speed of 4 m/min. Since the pitch of the pattern is 1090 mm, the exposure period T2 is 1090/66.7=16.34 sec. The controller 219 operates a laser emitter of a second illuminating section 235 based on a logical AND condition of the detection signal from the notch detection sensor 218 and scan start signal for the polygon mirror. To generate the scan start signal for the polygon mirror, the laser beam to be scanned by the rotating mirror is detected as the scan start signal by an optical detector such as a photodiode, or a leading edge of pulse signal for mirror control, which is outputted one time per one surface, is detected as scan start signal.

In the solid pattern exposure by the second exposure section 220 with use of the second photomask 230, since the deviation in the conveyance direction becomes smaller when the rotation speed of the polygon mirror becomes faster, the rotation speed of the polygon mirror with eighteen reflecting surfaces is set at ω2=2096 rpm. In this case, the scan speed Vb2 becomes Ls·ω2=492 m/sec because the distance Ls between the polygon mirror and the second photomask 230 is 2250 mm. Since the width Wb of the projection shape of the laser beam S2 is 1.2 mm, the exposure time $T2_{exp}$ of the laser beam S2 at this scan speed Vb2 becomes 1.2/Vb2=2.45 μsec, and the conveyance length Lc2 of the belt-like work 198 in this exposure time $T2_{exp}$ becomes $V·T2_{exp}$=0.16 μm. Since $V·T2_{exp}$=0.16 μm is sufficiently smaller than 90 mm length of the orthogonal section in the conveyance direction, the good exposure quality can be maintained. The number of the multiple exposure by the laser beam S2 having the long axis Lb of 3.6 mm becomes 34.

The pattern exposure method of the present invention can be applied to photographic exposure and so on in addition to the pattern exposure. Further, projection exposure can be used instead of the proximity exposure. In addition, although the belt-like work is used in the above embodiments, the present invention can be easily applied to continuous exposure on a sheet-like work while conveyance.

Various changes and modifications are possible in the present invention and may be understood to be within the present invention.

Industrial Applicability

The present invention is preferably applied to pattern exposure on a work for forming film-like optical members used for display devices and the like, especially for forming electromagnetic shielding films and the like.

The invention claimed is:

1. A pattern exposure method comprising steps of:
   continuously conveying a belt-like or sheet-like work having photosensitive layer; and
   periodically applying proximity exposure for a certain exposure time to said work through a photomask disposed at a predetermined proximity gap from said work and having a mask pattern so that a periodic pattern is formed on said work, said periodic pattern being a periodic arrangement of said mask patterns along a conveying direction of said work,
   wherein when a length of one period of said periodic pattern is a period length $L_0$, a width of said work in a direction perpendicular to said work conveying direction is a work width $W_0$, a length in said work conveying direction of a pattern area on which said mask pattern is provided is a pattern length L, a length in a work width direction of said pattern area is a pattern width W, a constant conveying speed of said work is V, an exposure period for exposing said periodic pattern is T, said exposure time is $T_{exp}$, and a minimum line width of said mask pattern is Dmin, said proximity exposure of said exposure time $T_{exp}$ being applied to an exposure area covering at least one period of said mask pattern in every said exposure period T, under following condition formulae:

$L_0 < L$;

$W_0 < W$;

$L_0/V \geq T$; and $V·T_{exp} < D\text{min}$.

2. A pattern exposure method claimed in claim 1, wherein a relation $Lb > L_0$ being satisfied when a length of light projected on said photomask from an exposure light source in said work conveying direction is Lb, said photomask having m numbers of said mask patterns being arranged in said work conveying direction when a quotient of $Lb/L_0$ being m (m is a natural number), and a same pattern being multiply-exposed through a nth mask pattern disposed downstream from a first mask pattern on a portion of said work where a latent image pattern is already exposed through said first mask pattern when this portion passes below said nth mask pattern by establishing synchronization between said work conveying speed V and said exposure period T such that a relation between said work conveying speed V and said exposure period T satisfying following formulae:

$(n-1) \times (L_0/V) = T$ (n is a natural number); and $2 \leq n \leq m$.

3. A pattern exposure method claimed in claim 2, wherein a density of said work reaches a desired value by said multiple exposure of n ($n \geq 2$) times.

4. A pattern exposure method claimed in claim 2, wherein said exposure light source scans the light in one direction during said exposure period T to expose overall width of said work through said photomask.

5. A pattern exposure method claimed in claim 4, wherein said exposure light source is a semiconductor laser emitter, said exposure being performed with a laser beam emitted from said semiconductor laser emitter and then collimated by a collimating lens.

6. A pattern exposure method claimed in claim 4, wherein said exposure light source is a plurality of semiconductor laser emitters, said exposure being performed with use of light which is formed such that plural laser beams are collimated respectively by a corresponding collimating lens and then said collimated beams are composited in a small area.

7. A pattern exposure method claimed in claim 4, wherein said exposure light source is two channels of semiconductor laser emitters, said exposure being performed with use of two channels of laser beams emitted from said semiconductor laser emitters and subjected to polarization multiplexing and then collimated by a collimating lens.

8. A pattern exposure method claimed in one of claims 5 to 6, wherein a wavelength of said laser beam is 405 nm.

9. A pattern exposure method claimed in claim 4, wherein said mask patterns are inclined in amount of V·W/Vb which is a moving length of said work in one scan, when a scan speed of said light from said exposure light source is Vb, toward a downstream side of laser scan in said work conveying direction from a position where a width direction of said mask patterns is perpendicular to said work conveying direction.

10. A pattern exposure method claimed in claim 4, wherein said exposure light source changes intensity of said light in response to the change of a scan speed, so that exposure amount on said work is kept constant in overall width.

11. A pattern exposure method claimed in claim 4, wherein said mask patterns are formed such that their positions are shifted Lg·sin θ toward inside in a width direction according to change of incident angle θ of said light from said exposure light source, when said proximity gap is Lg.

12. A pattern exposure method claimed in claim 4, wherein a width of said mask pattern is varied according to position in said work width direction of said scan, to keep a line width of said periodic pattern on said work uniform along said width direction.

13. A pattern exposure method claimed in claim 2, wherein when a length of said light projected on said photomask from said exposure light source along said width direction of said work is Lw, overall width of said work being exposed in said exposure time $T_{exp}$ through said photomask by said exposure light source, while satisfying a following formula:

$Lw > W$.

14. A pattern exposure method claimed in claim 1, wherein said proximity gap is no more than 500 μm.

15. A pattern exposure method claimed in claim 1, wherein said photosensitive layer is a silver salt photosensitive material or a photoresist.

16. A pattern exposure method claimed in claim 15, wherein said silver salt photosensitive material has a gradation γ of at least 5.

17. A pattern exposure method claimed in claim 1, wherein said periodic pattern is a continuous seamless pattern exposed on said belt-like work.

18. A pattern exposure method claimed in claim 1, wherein said periodic pattern has a line width of no more than 20 μm.

19. A pattern exposure method claimed in claim 1, wherein said periodic pattern is a mesh pattern forming an electromagnetic shielding member.

20. A pattern exposure method claimed in claim 1, wherein said proximity exposure is applied to said belt-like work which is hanged on a roller, through said photomask disposed close to an outer periphery of said roller.

21. A pattern exposure method claimed in claim 1, wherein synchronization between said conveying speed of said work and said exposure period for exposing said periodic pattern is monitored so that said exposure is performed only while said synchronization is established.

* * * * *